United States Patent
Zhou

(10) Patent No.: US 9,645,211 B2
(45) Date of Patent: May 9, 2017

(54) MAGNETIC RESONANCE IMAGING USING STEERING-PROPELLER

(75) Inventor: Xiaohong Joe Zhou, Naperville, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 1228 days.

(21) Appl. No.: 13/695,159

(22) PCT Filed: Apr. 29, 2011

(86) PCT No.: PCT/US2011/034634
§ 371 (c)(1),
(2), (4) Date: Jan. 25, 2013

(87) PCT Pub. No.: WO2011/137381
PCT Pub. Date: Nov. 3, 2011

(65) Prior Publication Data
US 2013/0147478 A1    Jun. 13, 2013

Related U.S. Application Data

(60) Provisional application No. 61/329,203, filed on Apr. 29, 2010.

(51) Int. Cl.
*G01R 33/44* (2006.01)
*G01R 33/28* (2006.01)
(Continued)

(52) U.S. Cl.
CPC ............. *G01R 33/44* (2013.01); *G01R 33/28* (2013.01); *G01R 33/4824* (2013.01); *G01R 33/5617* (2013.01)

(58) Field of Classification Search
CPC .... G01R 33/28; G01R 33/44; G01R 33/4824; G01R 33/5617; G01R 33/482; G01R 33/5615; G01R 33/5618
(Continued)

(56) References Cited

U.S. PATENT DOCUMENTS

| 5,151,656 A | 9/1992 | Maier et al. |
| 5,672,969 A | 9/1997 | Zhou et al. |

(Continued)

FOREIGN PATENT DOCUMENTS

WO    2005/001499    1/2005

OTHER PUBLICATIONS

Srinivasan et al., "Steer-PROP: A Grase-Propeller Sequence with Inter-Echo Steering Gradient Pulses," Proceedings of the International Society for Magnetic Resonance in Medicine, 18th Scientific Meeting and Exhibition, Stockholm, Sweden, May 1-7, 2010, Apr. 17, 2010 (Apr. 17, 2010), p. 2268.

(Continued)

*Primary Examiner* — Melissa Koval
*Assistant Examiner* — Rishi Patel
(74) *Attorney, Agent, or Firm* — McDonnell Boehnen Hulbert & Berghoff LLP

(57) ABSTRACT

A GRASE-type PROPELLER sequence called Steer-PROP is disclosed. This sequence exploits a serious of steer blips together with rewinding gradient pulse to traverse k-space. Steer-PROP improves the scan time by a factor of 3 or higher compared to FSE-PROPELLER, provides improved robustness to off-resonance effects compared to EPI-PROPELLER, and addresses a long-standing phase correction problem inherent to GRASE based sequences. Steer-PROP also enables intra-blade, inter-blade, and inter-shot phase errors to be separately determined and independently corrected.

22 Claims, 11 Drawing Sheets

(51) Int. Cl.
*G01R 33/48* (2006.01)
*G01R 33/561* (2006.01)

(58) Field of Classification Search
USPC .................................. 324/307, 309; 382/131
See application file for complete search history.

(56) References Cited

U.S. PATENT DOCUMENTS

2010/0188085 A1      7/2010   Huo et al.
2011/0241671 A1*   10/2011   Zhao .................. G01R 33/4824
                                                                             324/309

OTHER PUBLICATIONS

International Society for Magnetic Resonance in Medicine: "Call for Papers," Sep. 9, 2009 (Sep. 9, 2009), Retrieved from the internet: URL:htty://www.ismrm.org/10/call.htm [retrieved on Jun. 29, 2010].

Zhao et al., "Propeller Duo: Applied to Diffusion-Weighted Imaging," Proceedings of the International Society for Magnetic Resonance in Medicine, 17th Scientific Meeting and Exhibition, Honolulu, Hawaii, USA, Apr. 18-24, 2009, Apr. 4, 2009 (Apr. 4, 2009), p. 3518.

Li et al., "X-PROP: A fast and robust diffusion-weighted propeller technique," Magnetic Resonance in Medicine, vol. 66, No. 2, Jun. 9, 2011 (Jun. 9, 2011), pp. 341-347.

Tamhane et al., "Motion correction in periodically-rotated overlapping parallel lines with enhanced reconstruction (Propeller) and turboprop MRI," Magnetic Resonance in Medicine, vol. 62, No. 1, Apr. 13, 2009, (Apr. 13, 2009), pp. 174-182.

Pipe et al., "Turboprop: Improved Propeller imaging," Magnetic Resonance in Medicine, vol. 55, No. 2, Feb. 1, 2006 (Feb. 1, 2006), pp. 380-385.

Wang et al., "Propeller EPI: An MRI technique suitable for diffusion tensor imaging at high field strength with reduced geometric distortions," Magnetic Resonance in Medicine, vol. 54, No. 5, Jan. 1, 2005 (Jan. 1, 2005), pp. 1232-1240.

Tan et al., "3D Grase Propeller: Improved image acquisition technique for arterial spin labeling perfusion imaging," Magnetic Resonance in Medicine, vol. 66, No. 1, Jan. 19, 2011 (Jan. 19, 2011), pp. 168-173.

Pipe, Motion correction with Propeller MRI: application to head motion and free-breathing cardiac imaging, Magn Reson Med, 1999, 42:963-969.

Chuang et al., Propeller-EPI with parallel imaging using a circularly symmetric phased-array RF coil at 3.0 T: Application to high-resolution diffusion tensor imaging, Magnetic Reasonance in Medicine, 2006, 56:1352-1358.

Skare et al., Propeller EPI in the other direction, Magnetic Resonance in Medicine, 2006, 55:1298-1307.

Aldefeld et al., Effects of gradient anisotropy in MRI, Magnetic Resonance in Medicine, 1998, 39:606-614.

Zhou et al., A new Nyquist ghost in oblique EPI, Proc Int'l Soc Magn Reson Med 4th Meeting, New York, NY, p. 386, 1996.

Reeder et al, Referenceless interleaved echo-planar imaging, Magnetic Resonance in medicine, 1999, 41:87-94.

Pipe et al., Multishot diffusion-weighted FSE using Propeller MRI, Magnetic Resonance in Medicine, 2002, 47:42-52.

Hennig et al., Fast Imaging Using burst Excitation Pulses, Abstracts of the Soc Magn Reson Med, 1988:238.

Ahn et al., A new phase correction method in NMR imaging based on autocorrelation and histogram analysis, IEEE Transactions on Medical Imaging, 1987, 6:32-36.

Hinks et al., Fast spin echo prescan for artifact reduction, Third Soc Magn Reson, Absract, Nice, France, 1995, p. 634.

* cited by examiner

MAGNETIC RESONANCE IMAGING USING STEERING-PROPELLER

CROSS-REFERENCE TO RELATED APPLICATIONS

This Application is a U.S. National Phase of International Application No. PCT/US2011/034634 filed on Apr. 29, 2011, which claims the benefit of priority to U.S. Provisional Application 61/29,203 filed Apr. 29, 2010, both of which is hereby are incorporated by reference herein in their entirety.

BACKGROUND

Magnetic resonance imaging (MRI) is commonly used to image the internal tissues of a subject. MRI is typically performed by placing the subject or object to be imaged at or near the isocenter of a strong, uniform magnetic field, $B_0$, known as the main magnetic field. The main magnetic field causes the atomic nuclei (spins) that possess a magnetic moment in the matter comprising the subject or object to become aligned in the magnetic field. The spins form a magnetization that precesses around the magnetic field direction at a rate proportional to the magnetic field strength. For hydrogen nuclei (which are the common nuclei employed in MRI), the precession frequency is approximately 64 MHz in a magnetic field of 1.5 Tesla. If the magnetization is perturbed by a small radio-frequency magnetic field, known as $B_1$ magnetic field, the spins can emit radio frequency (RF) radiation at a characteristic frequency. The emitted RF radiation can be detected and analyzed to yield information that may be used to produce an image of the subject or object. For purposes of the discussion herein, the term "object" will be used to refer to either a subject (e.g., a person) or an object (e.g., a test object) when describing magnetic resonance imaging of that "object."

In practice, magnetic field gradients are also applied to the subject or object in addition to the main magnetic field. The field gradients are typically applied along one or more orthogonal axes, (x, y, z), the z-axis usually being aligned with the $B_0$, and introduce spatially-distributed variations in frequency and/or phase of the precessing nuclear spins. By applying the radio-frequency $B_1$ magnetic field and gradient fields in carefully devised pulses and/or sequences of pulses that are switched on and off, the RF radiation emitted can carry spatially encoded information that, when detected and analyzed, may be used to produce detailed, high resolution images of the subject or object. Various techniques utilizing both specific pulse sequences and advanced image reconstruction methods have been developed, providing new advances, as well as introducing new challenges.

Single-shot EPI (ss-EPI) is a popular pulse sequence for many fast imaging applications, such as functional imaging, diffusion imaging and perfusion imaging. In addition to its robustness against motion and high data acquisition efficiency, ss-EPI also features a low specific absorption rate (SAR), which is desirable especially for high-field imaging. As the scope of advanced imaging broadens, however, the limitations of ss-EPI have become increasingly evident. In addition to its high sensitivity to magnetic susceptibility variations and eddy currents, the use of a single shot imposes a constraint on maximal k-space coverage, which greatly reduces the achievable spatial resolution. This problem becomes more pronounced as the magnetic field increases, because the shortened T2* relaxation time narrows the usable sampling window.

A common approach to high spatial resolution is to employ multi-shot pulse sequences. In addition to resolution improvement, multi-shot EPI also reduces magnetic susceptibility artifacts and eddy current sensitivity. A major downside is that the sensitivity to motion is increased. An effective way to address the motion problem is to incorporate the Periodically Rotated Overlapping Parallel Lines with Enhanced Reconstruction (PROPELLER) sampling strategy (1) into multi-shot EPI. The initial implementation by Chung et al. assigned the phase-encoding direction along the short axis of the PROPELLER blades (2). Since the velocity of traversing k-space (dk/dt) remains slow along the phase-encoding direction, off-resonance effects in each blade still lead to significant artifacts. Recently, Skare et al. developed a different strategy whereby the phase-encoding direction is switched from the "long axis" to the "short axis" of the PROPELLER blades (3). This design dramatically increases the phase-encoding bandwidth, thereby reducing image distortion. Either implementation, however, suffers from off-resonance effects as well as a phenomenon known as "gradient anisotropy" (4), originally observed in oblique EPI acquisitions (5-7).

With its immunity to off-resonance effects, FSE or turbo spin echo (TSE) has been widely used clinically. Among a number of multi-shot FSE techniques developed over more than two decades, FSE with PROPELLER sampling has attracted a great deal of attention in recent years (8). In addition to the desirable properties inherited from FSE, PROPELLER-FSE provides effective self-navigation because of its inherent over-sampling around central k-space. Compared to EPI-PROPELLER pulse sequences, however, FSE-PROPELLER is considerably slower.

OVERVIEW

Embodiments disclosed herein provide a PROPELLER pulse sequence based on gradient and spin echo PROPELLER (GRASP) sequence with a novel k-space traversal strategy and a comprehensive phase correction scheme to obtain images with minimal or no artifacts in reduced data acquisition times compared to FSE-PROPELLER. The invention further includes identification of different types of phase errors that are typically entangled in previous methods and that may be separated and independently corrected for k-space data acquired using the GRASP sequences disclosed herein.

Hence, in one respect, various embodiments of the present invention provide, in a magnetic resonance imaging (MRI) system, a computer-implemented method comprising: applying to an object in the MRI system a first radio frequency (RF) pulse and, after a first fast spin echo (FSE) inter-echo time interval, applying to the object a second RF pulse; applying to the object during the first FSE inter-echo time interval between the first and second RF pulses a first magnetic field gradient ($G_x$) pulse train along a first direction, the first $G_x$ pulse train comprising an integer number M adjacent $G_x$ pulses, each consecutive pair of $G_x$ pulses of the first $G_x$ pulse train being separated by a $G_x$ steering pulse, and the last $G_x$ pulse of the first $G_x$ pulse train being followed by a first $G_x$ rewinding pulse; applying to the object simultaneously with the first $G_x$ pulse train a first magnetic field gradient ($G_y$) pulse train along a second direction, the first $G_y$ pulse train comprising M adjacent $G_y$ pulses, each $G_y$ pulse of the first $G_y$ pulse train forming a respective first-train $G_x$-$G_y$ pulse pair with a simultaneous corresponding $G_x$ pulse of the first $G_x$ pulse train, each consecutive pair of $G_y$ pulses of the first $G_y$ pulse train being separated by a $G_y$ steering pulse that forms a respective first-train $G_x$-$G_y$ steering-pulse pair with a simultaneous corresponding $G_x$ steering pulse of the first $G_x$ pulse train, and the last $G_y$ pulse of the first $G_y$ pulse train being followed by a first $G_y$ rewinding pulse that forms a first simultaneous $G_x$-$G_y$ rewinding-pulse pair with the first $G_x$ rewinding pulse of the first $G_x$ pulse train; acquiring k-space data along a first set of M mutually oblique lines intersecting in a central region of k-space, each of the M mutually oblique lines of the first set corresponding to a different respective first-train $G_x$-$G_y$ pulse pair, wherein applying each first-train $G_x$-$G_y$ steering-pulse pair repositions a starting point for k-space traversal from one of the M mutually oblique lines of the first set to another, and wherein applying the first simultaneous $G_x$-$G_y$ rewinding-pulse pair repositions a starting point for k-space traversal to a reference location of k-space.

In another respect, various embodiments of the present invention provide, in a magnetic resonance imaging (MRI) system, a computer-implemented method comprising: applying to an object in the MRI system a first gradient and spin echo propeller (GRASP) pulse sequence comprising a first radio frequency (RF) sequence of periodic RF pulses, an accompanying first magnetic field gradient ($G_x$) sequence of periodic $G_x$ pulse trains along a first direction, and an accompanying corresponding first magnetic field gradient ($G_y$) sequence of periodic $G_y$ pulse trains along a second direction, the first RF, $G_x$ and $G_y$ sequences being configured to cause traversal in k-space along a first plurality of parallel line groupings, each parallel line grouping of the first plurality forming a respective first GRASP blade, and each respective first GRASP blade being oblique to the other respective first GRASP blades and intersecting the other respective first GRASP blades in a central region of k-space; acquiring first GRASP k-space data from along the parallel line groupings of the first plurality during a first repetition time interval corresponding to a duration of the first GRASP pulse sequence; applying to the object a second GRASP pulse sequence comprising a second RF sequence of periodic RF pulses, an accompanying second $G_x$ sequence of periodic $G_x$ pulse trains, and an accompanying corresponding second $G_y$ sequence of periodic $G_y$ pulse trains, the second RF, $G_x$ and $G_y$ sequences being configured to cause traversal in k-space along a second plurality of parallel line groupings, each parallel line grouping of the second plurality forming a respective second GRASP blade, and each respective second GRASP blade being oblique to the other respective second GRASP blades and intersecting the other respective second GRASP blades in a central region of k-space; acquiring second GRASP k-space data from along the parallel line groupings of the second plurality during a second repetition time interval corresponding to a duration of the second GRASP pulse sequence; and separately determining and independently correcting: (i) phase errors in the acquired first GRASP k-space data between parallel lines of each respective first GRASP blade, (ii) phase errors in the acquired first GRASP k-space data between the respective first GRASP blades, (iii) phase errors in the acquired second GRASP k-space data between parallel lines of each respective second GRASP blade, (iv) phase errors in the acquired second GRASP k-space data between the respective second GRASP blades, and (v) phase errors in the acquired first GRASP and second GRASP k-space data between the first GRASP pulse sequence and the second GRASP pulse sequence.

In still another respect, various embodiments of the present invention provide an MRI system comprising: one or more processors; memory; a main magnet; a plurality of gradient coils positioned in the main magnet; an RF transceiver system; an RF coil assembly; a pulse module for transmitting signals to the RF coil assembly; an RF switch controlled by the pulse module; and machine-readable instructions stored in the memory that, when executed by the one or more processors, cause the MRI system to carry out functions including: applying to an object in the MRI system a first radio frequency (RF) pulse and, after a first fast spin echo (FSE) inter-echo time interval, applying to the object a second RF pulse, applying to the object during the first FSE inter-echo time interval between the first and second RF pulses a first magnetic field gradient ($G_x$) pulse train along a first direction, the first $G_x$ pulse train comprising an integer number M adjacent $G_x$ pulses, each consecutive pair of $G_x$ pulses of the first $G_x$ pulse train being separated by a $G_x$ steering pulse, and the last $G_x$ pulse of the first $G_x$ pulse train being followed by a first $G_x$ rewinding pulse, applying to the object simultaneously with the first $G_x$ pulse train a first magnetic field gradient ($G_y$) pulse train along a second direction, the first $G_y$ pulse train comprising M adjacent $G_y$ pulses, each $G_y$ pulse of the first $G_y$ pulse train forming a respective first-train $G_x$-$G_y$ pulse pair with a simultaneous corresponding $G_x$ pulse of the first $G_x$ pulse train, each consecutive pair of $G_y$ pulses of the first $G_y$ pulse train being separated by a $G_y$ steering pulse that forms a respective first-train $G_x$-$G_y$ steering-pulse pair with a simultaneous corresponding $G_x$ steering pulse of the first $G_x$ pulse train, and the last $G_y$ pulse of the first $G_y$ pulse train being followed by a first $G_y$ rewinding pulse that forms a first simultaneous $G_x$-$G_y$ rewinding-pulse pair with the first $G_x$ rewinding pulse of the first $G_x$ pulse train, acquiring k-space data along a first set of M mutually oblique lines intersecting in a central region of k-space, each of the M mutually oblique lines of the first set corresponding to a different respective first-train $G_x$-$G_y$ pulse pair, wherein applying each first-train $G_x$-$G_y$ steering-pulse pair repositions a starting point for k-space traversal from one of the M mutually oblique lines of the first set to another, and wherein applying the first simultaneous $G_x$-$G_y$ rewinding-pulse pair repositions a starting point for k-space traversal to a reference location of k-space.

In yet another respect, various embodiments of the present invention provide an MRI system comprising: one or more processors; memory; a main magnet; a plurality of gradient coils positioned in the main magnet; an RF transceiver system; an RF coil assembly; a pulse module for transmitting signals to the RF coil assembly; an RF switch controlled by the pulse module; and machine-readable instructions stored in the memory that, when executed by the one or more processors, cause the MRI system to carry out functions including: applying to an object in the MRI system a first gradient and spin echo propeller (GRASP) pulse sequence comprising a first radio frequency (RF) sequence of periodic RF pulses, an accompanying first magnetic field gradient ($G_x$) sequence of periodic $G_x$ pulse trains along a first direction, and an accompanying corresponding first magnetic field gradient ($G_y$) sequence of periodic $G_y$ pulse trains along a second direction, the first RF, $G_x$ and $G_y$ sequences being configured to cause traversal in k-space along a first plurality of parallel line groupings, each parallel line grouping of the first plurality forming a respective first GRASP blade, and each respective first GRASP blade being oblique to the other respective first GRASP blades and intersecting the other respective first GRASP blades in a central region of k-space, acquiring first GRASP k-space data from along the parallel line groupings of the first plurality during a first repetition time interval corresponding to a duration of the first GRASP pulse sequence, applying to the object a second GRASP pulse sequence comprising a second RF sequence of periodic RF pulses, an accompanying second $G_x$ sequence of periodic $G_x$ pulse trains, and an accompanying corresponding second $G_y$ sequence of periodic $G_y$ pulse trains, the second RF, $G_x$ and $G_y$ sequences being configured to cause traversal in k-space along a second plurality of parallel line groupings, each parallel line grouping of the second plurality forming a respective second GRASP blade, and each respective second GRASP blade being oblique to the other respective second GRASP blades and intersecting the other respective second GRASP blades in a central region of k-space, acquiring second GRASP k-space data from along the parallel line groupings of the second plurality during a second repetition time interval corresponding to a duration of the second GRASP pulse sequence, and separately determining and independently correcting: (i) phase errors in the acquired first GRASP k-space data between parallel lines of each respective first GRASP blade, (ii) phase errors in the acquired first GRASP k-space data between the respective first GRASP blades, (iii) phase errors in the acquired second GRASP k-space data between parallel lines of each respective second GRASP blade, (iv) phase errors in the acquired second GRASP k-space data between the respective second GRASP blades, and (v) phase errors in the acquired first GRASP and second GRASP k-space data between the first GRASP pulse sequence and the second GRASP pulse sequence.

In still another respect, various embodiments of the present invention provide a nontransitory computer-readable medium having instructions stored thereon that, upon execution by one or more processors of an MRI system, cause the MRI system to carry out functions comprising: one or more processors; memory; a bore magnet; a plurality of gradient coils positioned about the bore of a magnet; an RF transceiver system; an RF coil assembly; a pulse module for transmitting signals to the RF coil assembly; an RF switch controlled the a pulse module; and machine-readable instructions stored in the memory that, when executed by the one or more processors, cause the MRI system to carry out functions including: applying to an object in the MRI system a first radio frequency (RF) pulse and, after a first fast spin echo (FSE) inter-echo time interval, applying to the object a second RF pulse, applying to the object during the first FSE inter-echo time interval between the first and second RF pulses a first magnetic field gradient ($G_x$) pulse train along a first direction, the first $G_x$ pulse train comprising an integer number M adjacent $G_x$ pulses, each consecutive pair of $G_x$ pulses of the first $G_x$ pulse train being separated by a $G_x$ steering pulse, and the last $G_x$ pulse of the first $G_x$ pulse train being followed by a first $G_x$ rewinding pulse, applying to the object simultaneously with the first $G_x$ pulse train a first magnetic field gradient ($G_y$) pulse train along a second direction, the first $G_y$ pulse train comprising M adjacent $G_y$ pulses, each $G_y$ pulse of the first $G_y$ pulse train forming a respective first-train $G_x$-$G_y$ pulse pair with a simultaneous corresponding $G_x$ pulse of the first $G_x$ pulse train, each consecutive pair of $G_y$ pulses of the first $G_y$ pulse train being separated by a $G_y$ steering pulse that forms a respective first-train $G_x$-$G_y$ steering-pulse pair with a simultaneous corresponding $G_x$ steering pulse of the first $G_x$ pulse train, and the last $G_y$ pulse of the first $G_y$ pulse train being followed by a first $G_y$ rewinding pulse that forms a first simultaneous $G_x$-$G_y$ rewinding-pulse pair with the first $G_x$ rewinding pulse of the first $G_x$ pulse train, acquiring k-space data along a first set of M mutually oblique lines intersecting in a central region of k-space, each of the M mutually oblique lines of the first set corresponding to a different respective first-train $G_x$-$G_y$ pulse pair, wherein applying each first-train $G_x$-$G_y$ steering-pulse pair repositions a starting point for k-space traversal from one of the M mutually oblique lines of the first set to another, and wherein applying the first simultaneous $G_x$-$G_y$ rewinding-pulse pair repositions a starting point for k-space traversal to a reference location of k-space.

In yet another respect, various embodiments of the present invention provide a nontransitory computer-readable medium having instructions stored thereon that, upon execution by one or more processors of an MRI system, cause the MRI system to carry out functions comprising: one or more processors; memory; a bore magnet; a plurality of gradient coils positioned about the bore of a magnet; an RF transceiver system; an RF coil assembly; a pulse module for transmitting signals to the RF coil assembly; an RF switch controlled the a pulse module; and machine-readable instructions stored in the memory that, when executed by the one or more processors, cause the MRI system to carry out functions including: applying to an object in the MRI system a first gradient and spin echo propeller (GRASP) pulse sequence comprising a first radio frequency (RF) sequence of periodic RF pulses, an accompanying first magnetic field gradient ($G_x$) sequence of periodic $G_x$ pulse trains along a first direction, and an accompanying corresponding first magnetic field gradient ($G_y$) sequence of periodic $G_y$ pulse trains along a second direction, the first RF, $G_x$ and $G_y$ sequences being configured to cause traversal in k-space along a first plurality of parallel line groupings, each parallel line grouping of the first plurality forming a respective first GRASP blade, and each respective first GRASP blade being oblique to the other respective first GRASP blades and intersecting the other respective first GRASP blades in a central region of k-space, acquiring first GRASP k-space data from along the parallel line groupings of the first plurality during a first repetition time interval corresponding to a duration of the first GRASP pulse sequence, applying to the object a second GRASP pulse sequence comprising a second RF sequence of periodic RF pulses, an accompanying second $G_x$ sequence of periodic $G_x$ pulse trains, and an accompanying corresponding second $G_y$ sequence of periodic $G_y$ pulse trains, the second RF, $G_x$ and $G_y$ sequences being configured to cause traversal in k-space along a second plurality of parallel line groupings, each parallel line grouping of the second plurality forming a respective second GRASP blade, and each respective second GRASP blade being oblique to the other respective second GRASP blades and intersecting the other respective second GRASP blades in a central region of k-space, acquiring second GRASP k-space data from along the parallel line groupings of the second plurality during a second repetition time interval corresponding to a duration of the second GRASP pulse sequence, and separately determining and independently correcting: (i) phase errors in the acquired first GRASP k-space data between parallel lines of each respective first GRASP blade, (ii) phase errors in the acquired first GRASP k-space data between the respective first GRASP blades, (iii) phase errors in the acquired second GRASP k-space data between parallel lines of each respective second GRASP blade, (iv) phase errors in the acquired second GRASP k-space data between the respective second GRASP blades, and (v) phase errors in the acquired first GRASP and second GRASP k-space data between the first GRASP pulse sequence and the second GRASP pulse sequence.

These as well as other aspects, advantages, and alternatives will become apparent to those of ordinary skill in the art by reading the following detailed description, with reference where appropriate to the accompanying drawings.

DETAILED DESCRIPTION

Figure 1:
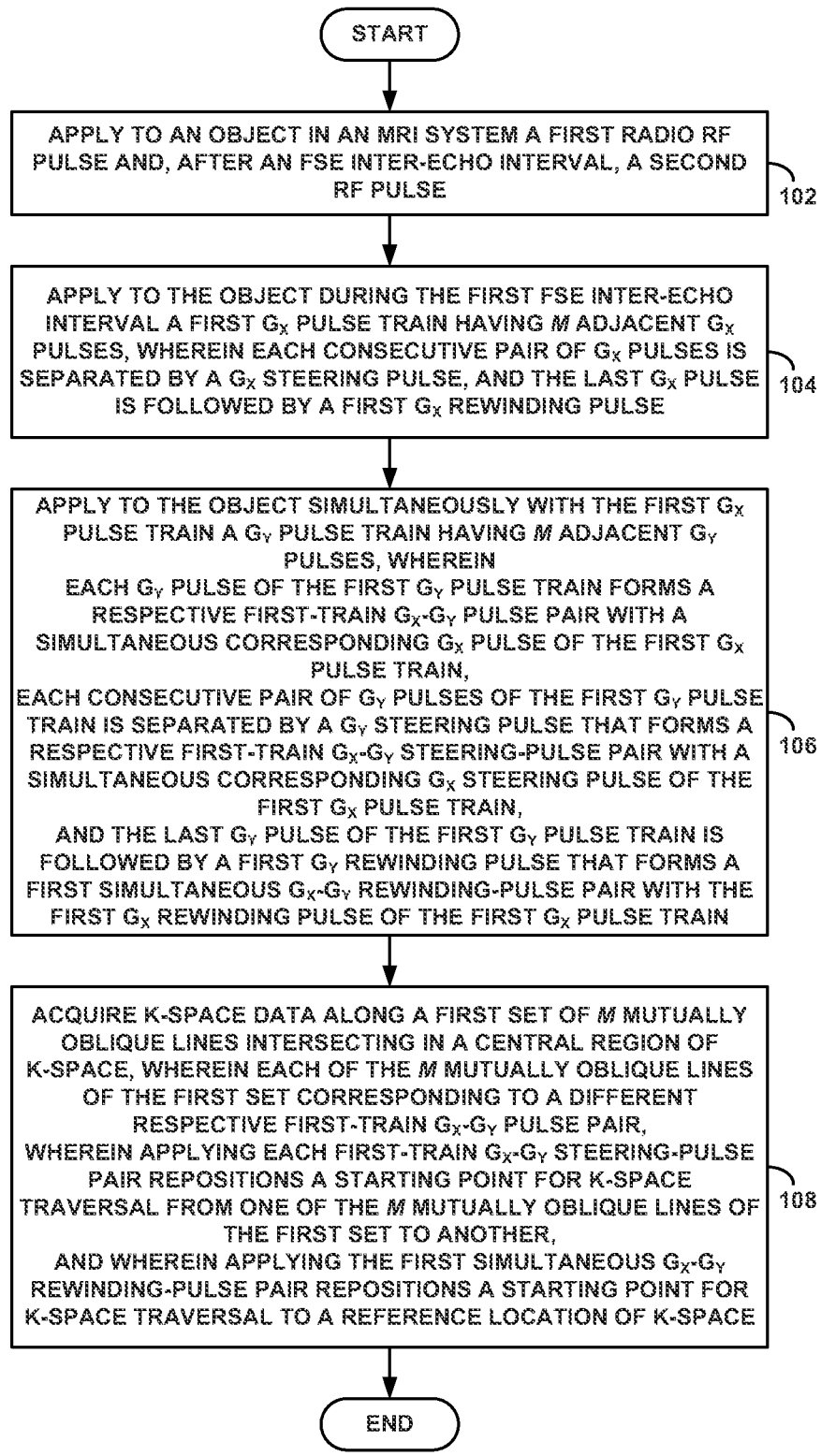
FIG. 1 illustrates an embodiment of an example Steer-PROP method for traversing k-space.

The embodiments disclosed herein by way of example provide example techniques applicable in an MRI system. An MRI system typically comprises hardware components including a plurality of gradient coils positioned about a bore of a magnet, an RF transceiver system, and an RF switch controlled by a pulse module to transmit RF signals to and receive RF signals from an RF coil assembly. The received RF signals are also known as magnetic resonance (MR) signal data. An MRI system also includes a computer programmed to cause the system to apply to an object in the system various RF signals, magnetic fields, and field gradients for inducing spin excitations and spatial encoding in an object, to acquire MR signal data from the object, to process the MR signal data, and to construct an MR image of the object from the processed MR signal data. The computer may include one or more general or special purpose processors, one or more forms of memory, and one or more hardware and/or software interfaces for interacting with and/or controlling other hardward components of the MRI system.

MR signal data detected from an object are typically described in mathematical terms as "k-space" data. k-Space is the Fourier inverse of image space. An image in actual space is produced by a Fourier transform of the k-space data. MR signal data are acquired by traversing k-space over the course of applying to the object the various RF pulses and magnetic field gradients. In practice, techniques for acquiring MR signal data from an object are closely related to techniques for applying the various RF pulses and magnetic field gradients to the object. The example embodiments disclosed herein relate to configuring RF pulses and magnetic field gradients so as to enable and/or cause k-space traversal for data acquisition in a particularly advantageous manner. Further, the example embodiments can be implemented in the form of one or more computer programs or applications that, when executed by the computer (e.g., one or more of the processors), cause the MRI system to apply the various RF pulses and magnetic field gradients, traverse k-space in the prescribed, advantageous manner, and acquire the corresponding MR signal data.

More particularly, the example embodiments offer specific advantages over k-space traversal techniques that employ strategies based on the PROPELLER method. Initially implemented in a multi-shot fast spin echo (FSE) pulse sequence, the PROPELLER method (1) traverses k-space using a series of rectangular strips rotated about the k-space origin. Each spin echo in the FSE echo train is used to acquire one line of k-space data, and thus the entire echo train produces a blade or strip consisting of N parallel k-space lines where N equals the echo train length (ETL). The subsequent repetitions (or "TRs") involve the rotation of frequency and phase encoding gradients about the slice-selection axis, producing additional blades in k-space, each rotated with an incremental angle to cover a complete circular area of k-space. The central k-space region is sampled by every blade, allowing self-navigation to compensate for motion. In-plane motion correction can be performed by reconstructing a series of low-resolution phase maps, one for each blade, based on the data in the central overlapping region. The motion-induced phase errors for a given blade are evaluated by comparing the phase against the phase of a reference blade, and subsequently removed during image reconstruction. Although PROPELLER offers robustness against motion, in certain applications, such as human brain diffusion studies, the time required for high-resolution imaging can become impractically long.

Gradient and spin echo (GRASE) is a hybrid of FSE and EPI that can be applied to PROPELLER that yields reduced scan time. One such technique, referred to "Turboprop" (9), increases the blade width, improving immunity to motion correction because a large amount of redundant data at the k-space central region can be used for evaluating data consistency. Each Turboprop scan consists of multiple, parallel blades that are combined into a single wider blade. However, inter-blade phase errors are complicated and not easy to be untangled.

More particularly, phase inconsistency can exist among the spin-echo signals if the Carr-Purcell-Meiboom-Gill (CPMG) condition is not satisfied (10). Additionally phase errors can also exist among the gradient echoes, primarily due to the polarity change of the readout gradient.

By traversing k-space of a GRASE sequence in a manner to produce multiple, mutually oblique blades that intersect and overlap near the origin (center) of k-space, the inter-blade phase errors advantageously can be separated and corrected independently. In order to achieve such obliquely intersecting blades in a single repetition time (TR) of a GRASE sequence, k-space traversal needs to be "steered" from one blade to another within each shot of a sequence (i.e., each TR). This can be achieved by devising specific gradient-echo pulse trains within each of multiple spin-echoes of a GRASE sequence. As disclosed herein, this technique is referred to as "Steer-PROP" and the corresponding sequence is referred to as "gradient and spin echo propeller (GRASP)." Beyond the advantageous phase error correction made possible, Steer-PROP also further significantly reduces the time to sample k-space data when compared to the original PROPELLER technique (1).

1. Steer-PROP Principles and Example Embodiment

Steer-PROP uses N RF refocusing pulses after each excitation RF pulse to produce a CPMG spin echo train. Each spin echo was further split into M gradient echoes by a bipolar readout gradient. By way of example, N could be in a range of 4-64, and M could be in the range of 3-7, although other values of M and/or N could be used. Steer-PROP employs a series of blip gradient pulses to distribute the M gradient echoes to M different blades. In doing so, M blades are sampled within each shot of a sequence (i.e., each TR).

An example embodiment of a method of Steer-PROP is illustrated in FIG. 1. By way of example, the example method can be a computer-implemented method in an MRI system such as the one described above.

As illustrated in FIG. 1, at step 102, following an excitation radio frequency (RF) pulse, a first RF pulse is applied to an object in the MRI system, and after a first fast spin echo (FSE) inter-echo time interval, as second RF pulse is applied to the object.

At step 104, in the first FSE inter-echo time interval between the first and second RF pulses, a first magnetic field gradient ($G_x$) pulse train is applied to the object along a first direction. The first $G_x$ pulse train includes an integer number M adjacent $G_x$ pulses, and consecutive pairs of $G_x$ pulses of the first $G_x$ pulse train are separated by a $G_x$ steering pulse. The last $G_x$ pulse of the first $G_x$ pulse train is followed by a first $G_x$ rewinding pulse.

At step 106, a first magnetic field gradient ($G_y$) pulse train is applied to the object along a second direction. The first $G_y$ pulse train includes M adjacent $G_y$ pulses, and consecutive pairs of $G_y$ pulses of the first $G_y$ pulse train are separated by a $G_y$ steering pulse. The last $G_y$ pulse of the first $G_y$ pulse train is followed by a first $G_y$ rewinding pulse. Each $G_y$ pulse of the first $G_y$ pulse train forms a respective first-train $G_x$-$G_y$ pulse pair with a simultaneous corresponding $G_x$ pulse of the first $G_x$ pulse train. Further, each $G_y$ steering pulse forms a respective first-train $G_x$-$G_y$ steering-pulse pair with a simultaneous corresponding $G_x$ steering pulse of the first $G_x$ pulse train, and the first $G_y$ rewinding pulse forms a first simultaneous $G_x$-$G_y$ rewinding-pulse pair with the first $G_x$ rewinding pulse of the first $G_x$ pulse train.

Finally, at step 108, k-space data are acquired along a first set of M mutually oblique lines intersecting in a central region of k-space, wherein each of the M mutually oblique lines of the first set corresponds to a different respective first-train $G_x$-$G_y$ pulse pair.

In accordance with the example embodiment, the first direction, along which $G_x$ is applied, and the second direction, along which $G_y$ is applied are orthogonal to one another.

In accordance with the example embodiment, applying each first-train $G_x$-$G_y$ steering-pulse pair repositions a starting point for k-space traversal from one of the M mutually oblique lines of the first set to another. In addition, applying the first simultaneous $G_x$-$G_y$ rewinding-pulse pair repositions a starting point for k-space traversal to a reference location of k-space. By way of example, M could be in a range of 3-7, although values outside of this range could be used as well.

In further accordance with the example embodiment, the first and second RF pulses are an RF refocusing pulse, the first resulting in a spin-echo. Each of the magnetic field gradient pulses $G_x$ and $G_y$ results in a gradient echo. Taking M=3, as an example, three gradient echoes would be generated within the first spin echo interval between the first and second RF refocusing pulses. The second refocusing pulse would result in a second spin echo.

It will be appreciated that Steer-PROP could also be embodied as a non-transitory computer-readable medium, such as magnetic disk, CD-ROM, or the like, having non-transitory computer-readable medium having stored thereon computer-executable instructions that, if executed a processor or processors of the MRI system, cause the MRI system to perform functions of the example method as described above. It will also be appreciated that the method steps described above could be modified or rearranged, and that additional steps could be added, without changing the scope or spirit of the example embodiment or other Steer-PROP embodiments. For example, $G_x$ and $G_y$ pulses that are described above as being paired (including steering and rewinding pulses) may not need to be applied strictly simultaneously. In some embodiments, the temporal relation prescribed by the design of the $G_x$ and $G_y$ pulse trains could be such that paired pulses are approximately rather than strictly simultaneous.

a. Steering

Figure 2:
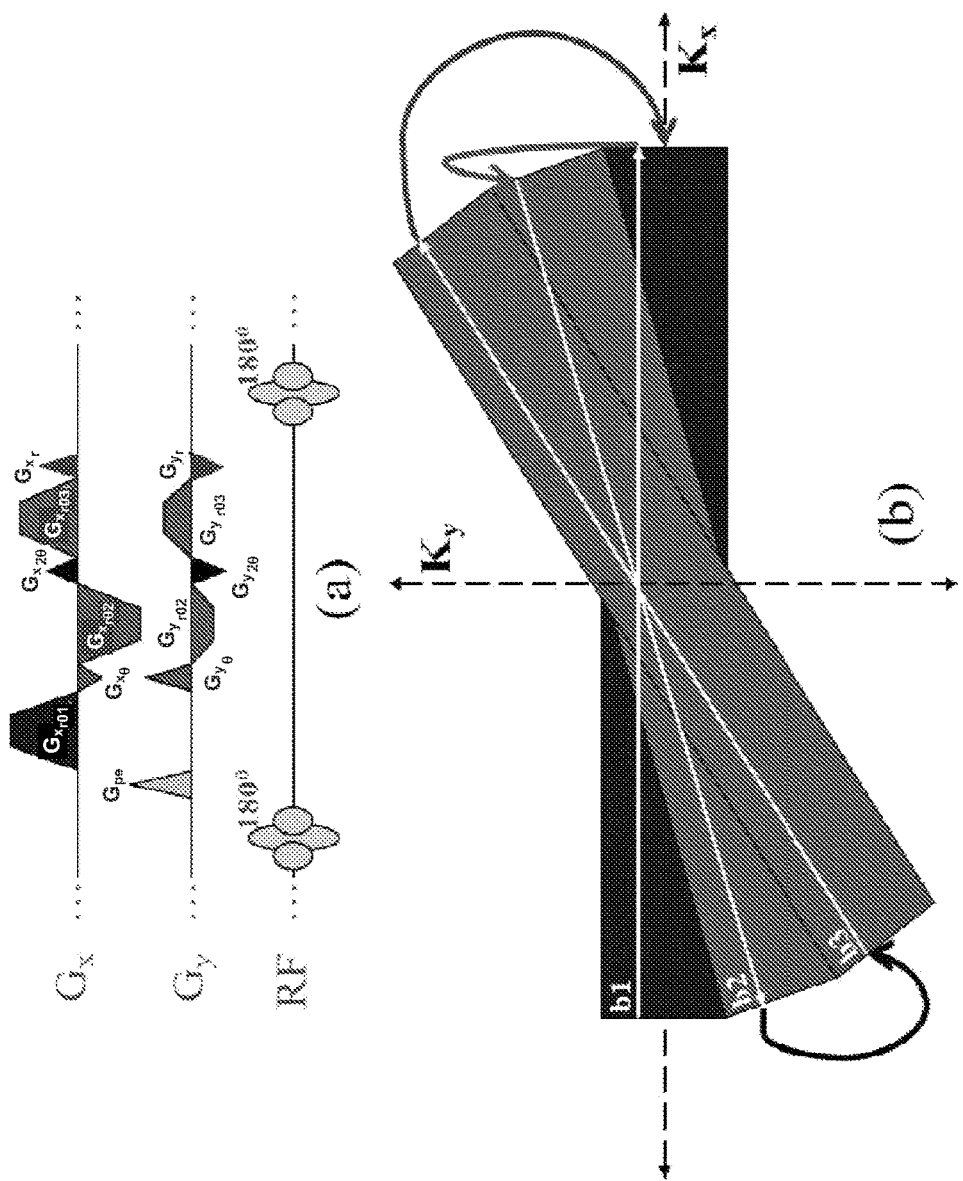
FIG. 2(a,b) is a schematic illustration of an inter-spin-echo segment (a) of the Steer-PROP sequence and the corresponding k-space traversal (b).

FIG. 2a illustrates $G_x$ and $G_y$ pulse trains with M=3, and FIG. 2b shows the resulting k-space traversal along three blades. The three gradient lobes, shown as trapezoids, correspond to acquisition k-space data for each of the three blades. Note that the apparent absence of a first $G_y$ pulse actually corresponds to a pulse amplitude of zero. The Steering pulses are shown as triangles (although other shapes of gradient pulses can also be used), and are referred to as steer blips. They are used to steer the k-space trajectory to the desired blade. The triangular gradient pulses at the end of the gradient echo train rewind the phase in order to satisfy the CPMG condition. Typically, k-space is described in a rectangular coordinate system with orthogonal axes $k_x$ and $k_y$. In such a description, $G_x$ is applied along the $k_x$-axis and $G_y$ is applied along the $k_y$-axis. It will be appreciated that other coordinate systems, such as a radial coordinate system could be used to describe k-space.

The traversal of k-space resulting from the pulse trains is illustrated in FIG. 2b. The line b1 is first traversed. Since the amplitude of $G_y$ is zero for the first gradient echo, as noted above, the $k_y$-component of the line b1 is zero, and the b1 is thus horizontal. The first pair of steering blips then steers to the next (second) starting point on line b2. The second pair of steering blips then steers to the next (third) starting point on line b3. Finally, the rewind pulse pair returns to the initial point in k-space. A single spin echo interval containing a $G_x$-$G_y$ gradient echo pulse train, such as the one shown in FIG. 2a is referred to herein a "segment."

Figure 3:
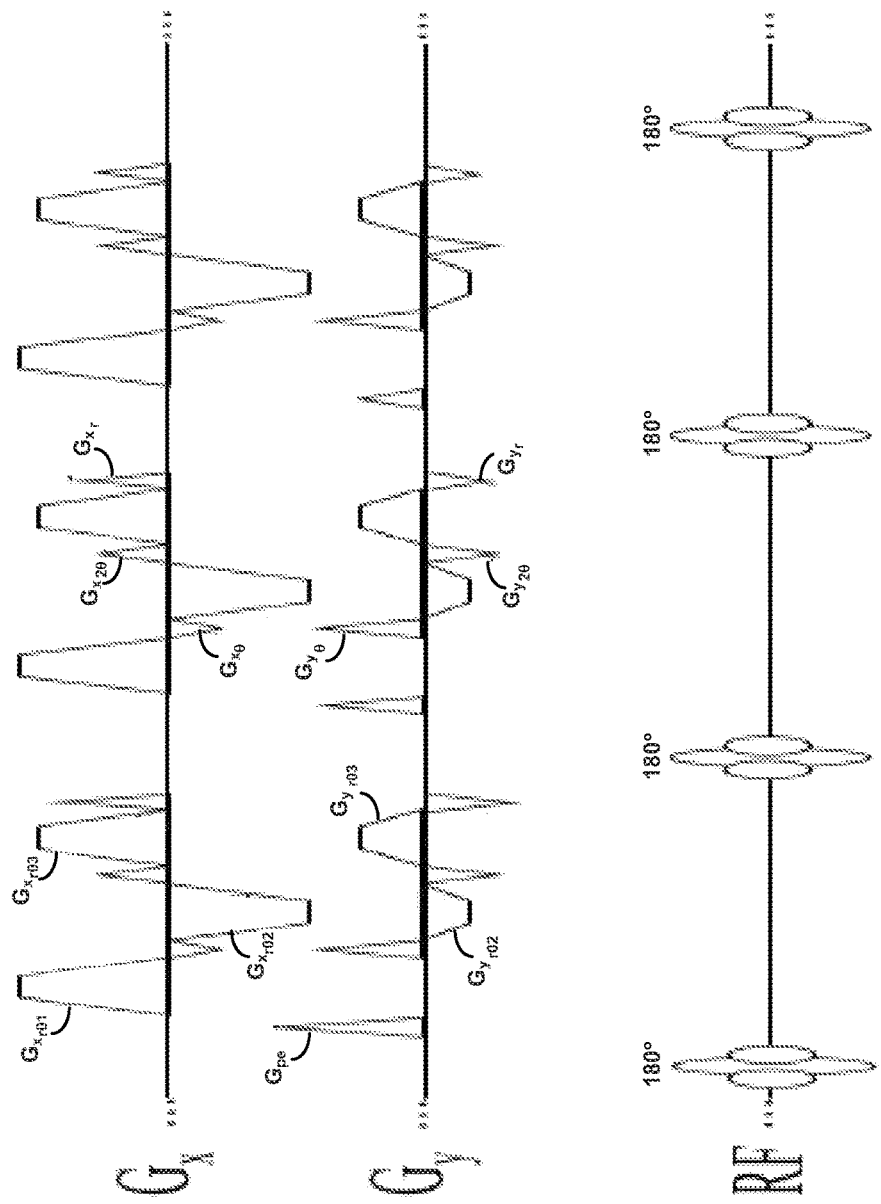
FIG. 3 illustrates a segment of Steer-PROP sequence showing 3 gradient echoes for each spin echo and the corresponding Steer-blip pulses between them.

By repeating segments within a pulse sequence while varying the phase-encoding gradient $G_{pe}$ (see FIG. 2a) in each segment, lines parallel but offset from b1, b2, b3 result in filling out three blades, as indicated. Each repeat segment results in different set of M lines distributed among M blades. A sequence of three spin echoes, each having gradient pulse trains ($G_x$ and $G_y$ trains), is illustrated in FIG. 3.

For a segment repeated N times N lines will fill out each of the M blades. With this scheme, each excitation (or TR) acquires a total of M×N k-space lines that are evenly distributed among the M blades, improving the data acquisition speed by a factor of M as compared to FSE-PROPELLER with the same spin echo train length. For a desired matrix size L, the minimum number of excitations P to cover k-space fully can be calculated by $$P = \frac{\pi}{2} \frac{L}{M \times N} \quad (1)$$

Figure 4:
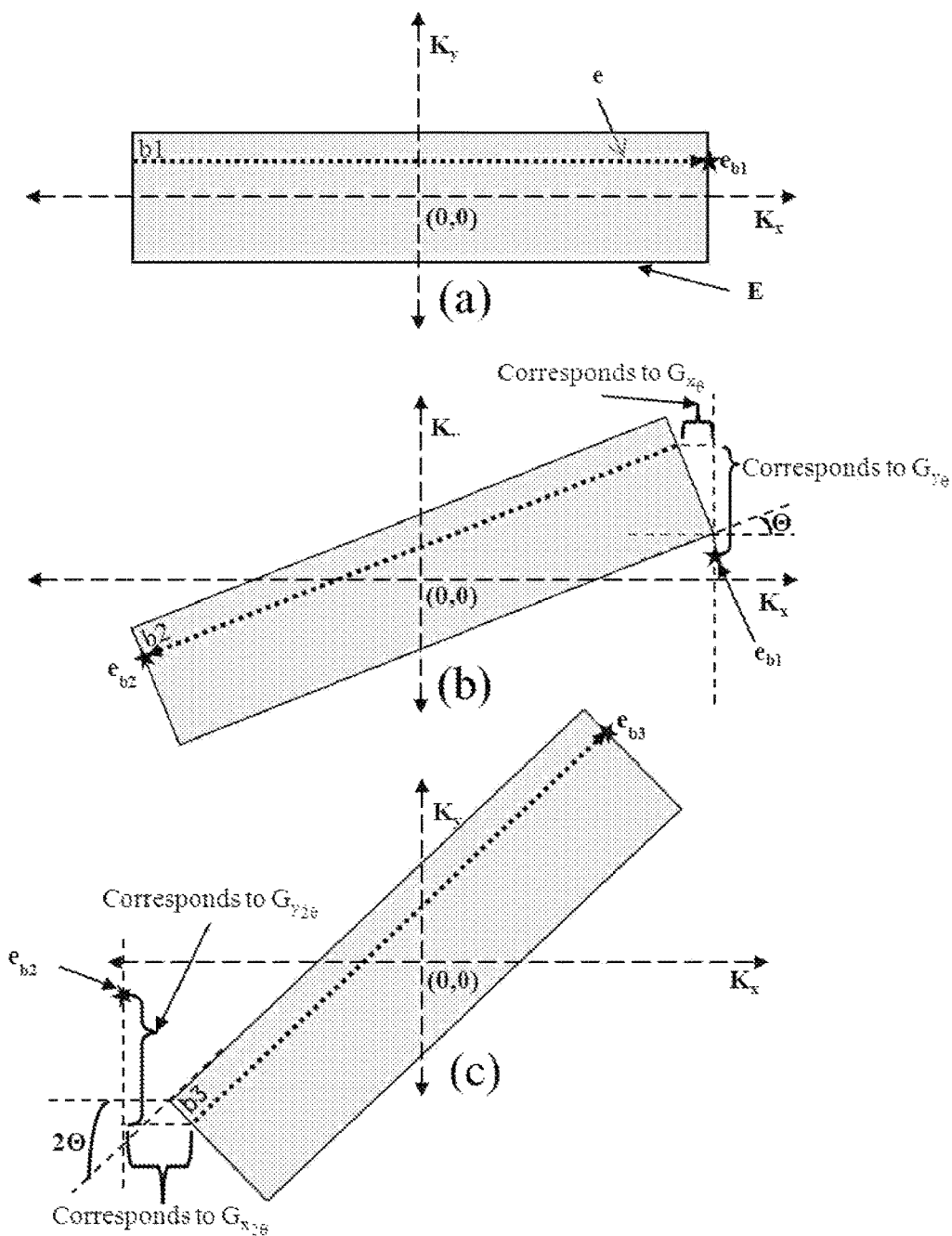
FIG. 4 illustrates a blip design showing k-space transitions through blades 1(a), 2(b) and 3(c).

The area, instead of the amplitude alone, of the steep blips controls how the k-space traversal is accomplished. In order to achieve the k-space traversal shown in FIG. 2b, the areas of individual steer blip pulses are calculated, as shown in FIG. 4. These steer blip pulse areas depend on the phase encoding amplitude of the spin-echo under consideration and the rotation angle between two successive blades, θ. The area under a particular phase encoding gradient lobe ($A_y$) and the area corresponding to the largest phase encoding step ($A_{y_{max}}$) are given by equations 2 and 3 respectively, as:

$$A_y = \frac{e - 0.5}{FOV \times \gamma} \quad (2)$$

$$A_{y_{max}} = \frac{E - 0.5}{FOV \times \gamma} \quad (3)$$

where FOV is the field of view in units of cm, γ is the gyromagnetic ratio (42.58×MHz/T for proton spins), e is in the range $-E+1 \leq e \leq E$ and corresponds to a given phase-encoding step within the blade, and E corresponds to the largest positive phase encoding step, and is related to the echo train length (M) by $$E = \frac{M - 2}{2}.$$

The area $A_y$ has a positive or negative sign depending upon the location of the phase-encoding step.

Steering between blades is based on the gradient areas given by equations 2 and 3 and converting them into the corresponding components along the readout and phase-encoding directions of the subsequent blades using the blade rotation angle θ.

To compute the area required for the steering blip pulses, k-space distance between the end of the current blade and the beginning of the subsequent blade is needed. For example, in the case of k-space distance corresponding to $G_{y_\theta}$ (FIG. 4b) the traversal comprises moving from point $e_{b1}$ to the top of blade b2. The gradient area required for this step is given by equation 4. The area $A_{x_\theta}$ required for the gradient blip $G_{x_\theta}$ is computed as shown in equation 5. A similar strategy is applied to obtain the traversal between blades b2 and b3 with the areas $A_{y_{2\theta}}$ (for $G_{y_{2\theta}}$) and $A_{x_{2\theta}}$ (for $G_{x_{2\theta}}$) given by equations 6 and 7.

$$A_{y_\theta} = (A_{y_{max}} - A_y) + (A_{y_{max}} + A_y)\cos\theta \quad (4)$$

$$A_{x_\theta} = -(A_{y_{max}} + A_y)\sin\theta \quad (5)$$

$$A_{y_{2\theta}} = (A_{y_{max}} - A_y)\cos\theta - (A_{y_{max}} + A_y)\cos 2\theta \quad (6)$$

$$A_{x_{2\theta}} = (A_{y_{max}} - A_y)\sin\theta + (A_{y_{max}} + A_y)\sin 2\theta \quad (7)$$

It can be observed from FIGS. 4b and 4c that gradients $G_{x_\theta}$ and $G_{y_{2\theta}}$ have negative polarity as required by their traversal direction.

It is noted that the gradient waveforms shown in FIGS. 2a and 3 are incomplete. For example, the pre-phasing gradient along the $G_x$ direction is not shown because this gradient pulse is typically applied between an excitation RF pulse and a refocusing RF pulse. Additionally, the slice-selection gradient is also omitted because slice-selection gradient is not involved in the steer process. It is worth noting that the last gradient pulse in the segment for either $G_x$ or $G_y$ pulse train is important as it returns the k-space trajectory to a consistent position.

b. View Ordering

Figure 5:
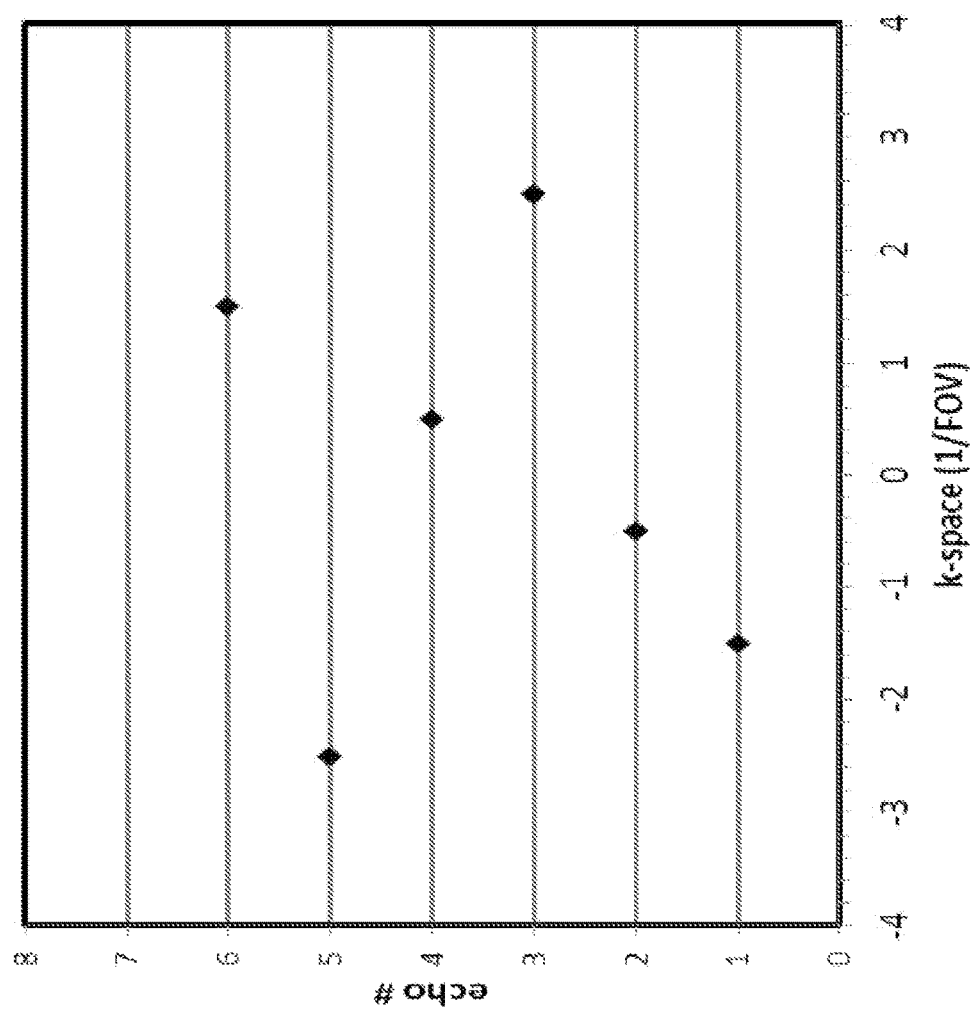
FIG. 5 illustrates a distribution of echoes across the k-space showing the view ordering.

Between each refocusing pulse, the spin-echo amplitude decays according to $T_2$ relaxation. As a result, the SNR is lower for lines acquired near the end of the echo train compared to the lines acquired earlier. Assigning the spin echoes in linear format can cause large signal amplitude discontinuities between blades which then lead to severe ghosting artifacts. In the case of diffusion imaging, application of the diffusion gradients causes deviations from the CPMG condition, leading to phase and magnitude instability in the odd-numbered spin echoes. In order to compensate for these effects the following described view ordering scheme can be used (as shown in FIG. 5). The even echoes are assigned across the center of the blade, so that the signal at the center of k-space is stable. Odd echoes are split between the blade edges, assigned so that the $T_2$ decay profile across the blade does not have any sharp discontinuities.

c. Phase Errors and Corrections

The Steer-PROP technique faces three kinds of phase errors that need to be accounted for in order to obtain images of acceptable quality.

1. Inter-Shot: Phase inconsistency (errors) in between TR's caused primarily by motion;
2. Inter-Blade: Phase inconsistency (errors) between the different gradient echoes that are distributed across different blades;
3. Intra-Blade: Phase inconsistency (errors) across the different k-space lines within a given blade.

One of the advantages of Steer-PROP is the ability to separately determine and independently correct for the three type of phase error described above. Further detail is provided below.

Intra-Blade Phase Errors

To obtain the intra-blade phase errors, two single-shot orthogonal reference scans (ORS) are acquired during pre-scan using GRASP pulse sequences with a zero blade angle (i.e., θ=0). In the first reference scan, the readout gradient is applied along the x-axis, and all gradient activity along the y-axis is disabled. In the second reference scan, the gradient waveforms are swapped between the x- and y-axes. For each reference scan, the gradient echoes of all spin echoes are Fourier transformed to obtain complex projections of the object. From these projections, spatially constant (α) and linear (β) phase errors are calculated using the method proposed by Ahn and Cho (11):

reference scan 1: $\alpha_{1mn}$, $\beta_{1mn}$ for m=1, . . . , M blades, and n=1, . . . , N lines, reference scan 2: $\alpha_{2mn}$, $\beta_{2mn}$ for m=1, . . . , M blades, and n=1, . . . , N lines, where the first subscript represents the reference scan number, m and n denote the gradient echo and spin echo indices, respectively. For a given blade m with an orientation angle $\phi_m$, the constant (ξ) and linear (ψ) phase errors among the k-space lines are obtained as follow:

$$\xi_{mn} = \alpha_{1mn}\cos\phi_m + \alpha_{2mn}\sin\phi_m \quad (8)$$

$$\psi_{mn} = \beta_{1mn}\cos^2\phi_m + \beta_{2mn}\sin^2\phi_m. \quad (9)$$

With known phase errors, intra-blade phase correction will proceed using the established phase correction method for each blade by adjusting the receiver frequency and a tweaking gradient area (12).

Inter-Blade Phase Errors

With the removal of the intra-blade phase error, the inter-blade phase errors within a shot can be corrected using two approaches. First, phase inconsistencies among the M gradient echoes acquired from the ORS described above can be used. The central gradient echo of the first spin echo can be selected as a reference and the phase errors for all other gradient echoes are estimated with respect to the reference. Both constant and linear phase errors are removed during reconstruction using an established method developed for EPI (13). Second, the inter-blade phase errors within a shot can be estimated by comparing the phase among the blades in the same shot using redundant data in the central k-space region traversed by all blades. The phase inconsistency can then by removed during image reconstruction. This method is similar to the one originally proposed by Pipe (1), except that only M blades, one corresponding to each gradient echo within the same shot, are used to perform phase correction, instead of using all PROPELLER blades.

Inter-Shot Phase Errors.

The motion-induced inter-shot phase errors are corrected by comparing the phase between different excitation groups based on data consistency in the central overlapping region of k-space. The algorithm originally proposed by Pipe (1) for FSE-PROPELLER can be used to remove the inter-shot phase errors in GRASP, except that a comparison is made between the phase of different groups of blades acquired from different shots, instead of on a blade by blade basis. Both in-plane and through plane motion are corrected in this manner.

Figure 6:
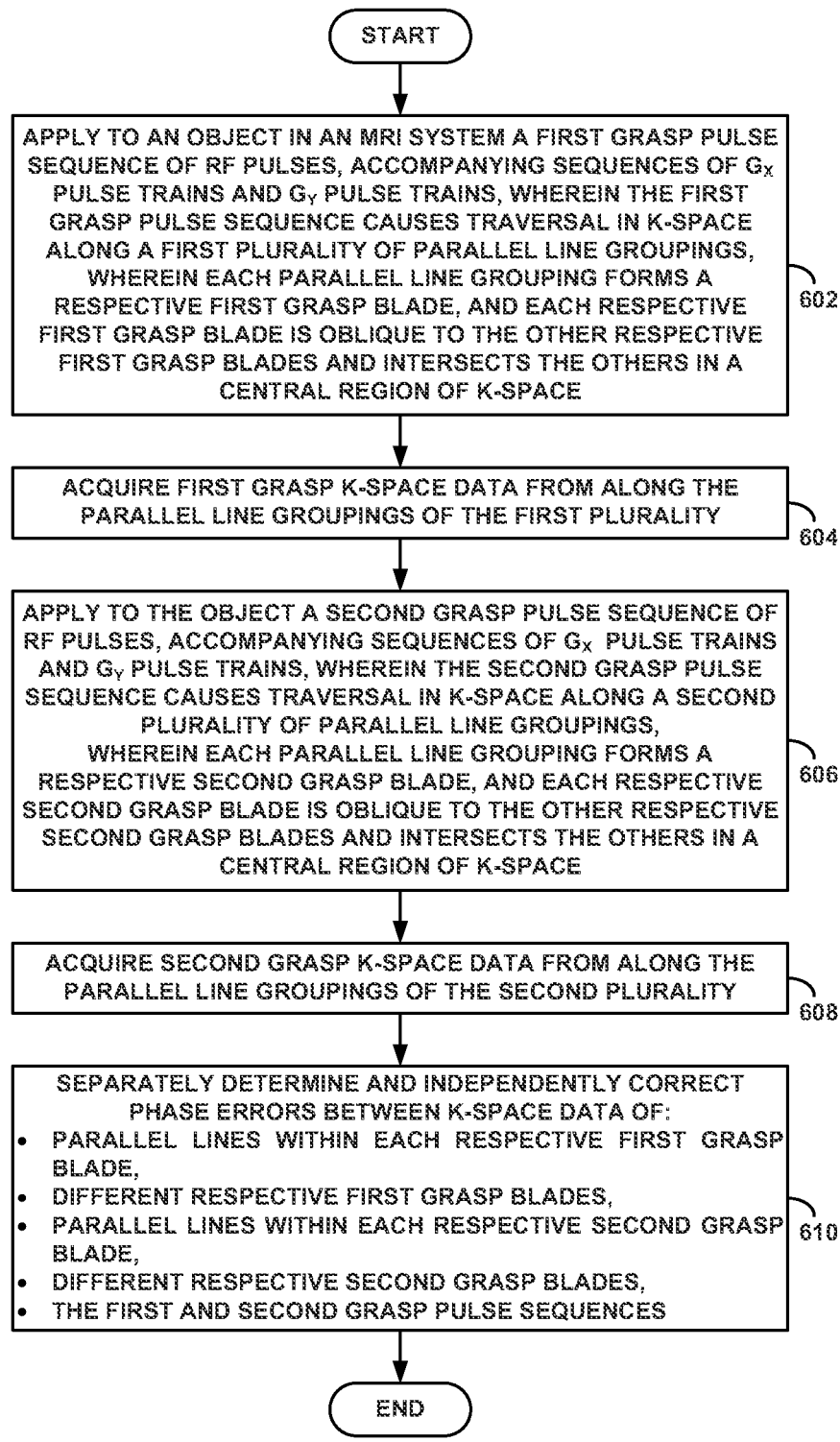
FIG. 6 illustrates an embodiment of an example Steer-PROP method for phase error correction.

An example embodiment of a method of phase error correction based on Steer-PROP traversal of k-space is illustrated in FIG. 6. By way of example, the example method could be a computer-implemented method in an MRI system such as the one described above.

As shown in FIG. 6, at step 602 a first GRASP sequence is applied to an object in the MRI system. In accordance with the example embodiment, the first GRASP sequence could comprise a first radio frequency (RF) sequence of periodic RF pulses, an accompanying first magnetic field gradient ($G_x$) sequence of periodic $G_x$ pulse trains along a first direction, and an accompanying corresponding first magnetic field gradient ($G_y$) sequence of periodic $G_y$ pulse trains along a second direction. By designing the first RF, $G_x$ and $G_y$ sequences in accordance with the steering technique describe above, they can be configured to cause traversal in k-space along a first plurality of parallel line groupings, where each parallel line grouping of the first plurality forms a respective first GRASP blade, and each respective first GRASP blade is oblique to the other respective first GRASP blades and intersects the other respective first GRASP blades in a central region of k-space.

At step 604, first GRASP k-space data are acquired from along the parallel line groupings of the first plurality during a first repetition time interval corresponding to a duration of the first GRASP pulse sequence (e.g., the first shot).

At step 606, a second GRASP sequence is applied to the object in the MRI system. In accordance with the example embodiment, the second GRASP sequence comprises a second radio frequency (RF) sequence of periodic RF pulses, an accompanying second magnetic field gradient ($G_x$) sequence of periodic $G_x$ pulse trains along a second direction, and an accompanying corresponding second magnetic field gradient ($G_y$) sequence of periodic $G_y$ pulse trains along a second direction. By designing the second RF, $G_x$ and $G_y$ sequences in accordance with the steering technique describe above, they can be configured to cause traversal in k-space along a second plurality of parallel line groupings, where each parallel line grouping of the second plurality forms a respective second GRASP blade, and each respective second GRASP blade is oblique to the other respective second GRASP blades and intersects the other respective second GRASP blades in the central region of k-space.

At step 608, second GRASP k-space data are acquired from along the parallel line groupings of the second plurality during a second repetition time interval corresponding to a duration of the second GRASP pulse sequence (e.g., the second shot).

Finally, at step 610, phase errors are separately determined and independently corrected for: (i) intra-blade k-space data in the first GRASP k-space data, (ii) inter-blade k-space data in the first GRASP k-space data, (iii) intra-blade k-space data in the second GRASP k-space data, (iv) inter-blade k-space data in the second GRASP k-space data, and (v) inter-shot k-space data between the first and second shots.

It will be appreciated that phase error correction using the Steer-PROP technique or GRASP sequence can also be embodied as a non-transitory computer-readable medium, such as magnetic disk, CD-ROM, or the like, having non-transitory computer-readable medium having stored thereon computer-executable instructions that, if executed a processor or processors of the MRI system, cause the MRI system to perform functions of the example method as described above. It will also be appreciated that the method steps described above could be modified or rearranged, and that additional steps could be added, without changing the scope or spirit of the example embodiment or other embodiment of phase error correction using Steer-PROP. For example, $G_x$ and $G_y$ pulses that are described above as being paired (including steering and rewinding pulses) may not need to be applied strictly simultaneously. In some embodiments, the temporal relation prescribed by the design of the $G_x$ and $G_y$ pulse trains could be such that paired pulses are approximately rather than strictly simultaneous.

2. Example Operation and Results a. Example Procedure

The Steer-PROP sequence was first implemented and tested on a 3.0 T GE Signa HDx scanner (GE Healthcare, Waukesha, Wis., USA). An FSE pulse sequence was modified to implement the Steer-PROP pulse sequence, as explained in above. This pulse sequence was initially tested on the cylindrical GE DQA phantom, using the quadrature head coil, supplied by the scanner manufacturer. $T_2$-weighted Steer-PROP images were acquired in the axial plane with the following imaging parameters: TR=4 s and TE=72 ms. For the purpose of comparison, a similar image was obtained using a conventional FSE-based PROPELLER sequence with the same imaging parameters.

Following this verification, several experiments were performed on a healthy female volunteer (age: 29 years) to evaluate the Steer-PROP sequence. All experiments were carried out using the quadrature head coil. In the first volunteer experiment, axial T2 and diffusion weighted images were obtained in the brain, using the following imaging parameters: TR=4000 ms, TE=128 ms, ETL=8, matrix size=256, FOV=26 cm, slice thickness=5 mm, b=500 s/mm$^2$, NEX=2, and scan time=2 min 13 sec. For comparison, corresponding images were also obtained using the FSE-PROPELLER sequence. As diffusion-weighting images are commonly acquired using single-shot spin-echo EPI, a DW-EPI acquisition was performed with matching imaging parameters.

To assess the robustness of the Steer-PROP sequence to subject motion, the volunteer was trained to move her head with low to moderate frequency at regular intervals during the acquisition. Axial Steer-PROP and FSE-PROPELLER images were acquired with the same imaging parameters given above, at a slice location similar to the previous acquisition. Both acquisition strategies were compared against a standard multi-shot T2-weighted Cartesian FSE acquisition. Subject motion was comparable over all three scans.

Dielectric resonance effects are usually more pronounced at higher field strengths, and result in a significant brightening of the center of the image. As this effect may complicate the assessment of Steer-Prop images at 3.0 T, the pulse sequence was also implemented on a 1.5 T GE Signa HDx scanner. With this pulse sequence, axial Steer-PROP images were acquired at 1.5 T with the quadrature transmit-receive head coil using the following imaging parameters: TR=4 s, TE=72 ms, ETL=8, FOV=24 cm, Slice Thickness=5 mm, BW=125 KHz, Matrix Size=256×256 and NEX=2.

To demonstrate the robustness of Steer-PROP, diffusion weighted images were further acquired on axial and non-axial (i.e., sagittal, coronal and oblique) planes on the volunteer using the following imaging parameters: TR=4 s, TE=72 ms, ETL=8, FOV=24 cm, Slice Thickness=5 mm, BW=125 KHz, Matrix Size=256×256 and NEX=2, b=500 s/mm$^2$. The oblique plane was chosen parallel to the cerebellar tentorium, ~40° from the axial plane on the volunteer. Single-shot EPI images were acquired at the same locations with similar imaging parameters.

b. Results

Figure 7:
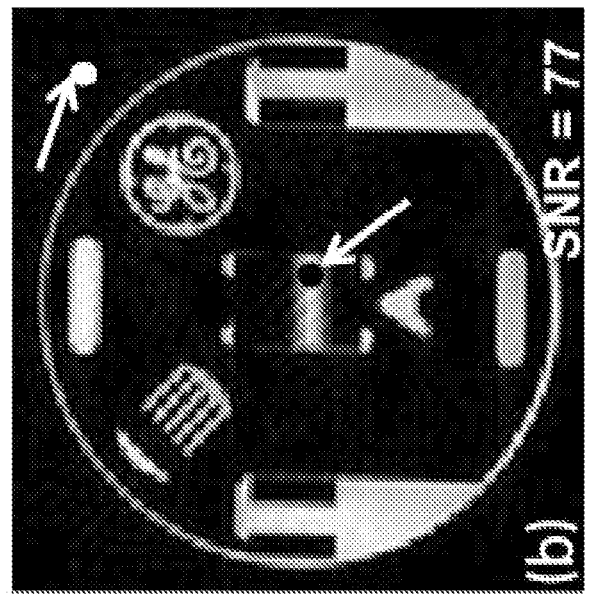
FIG. 7 compares phantom images obtained at 3T using a FSE-PROP (a) and steer-PROP (b), respectively.
Figure 7:
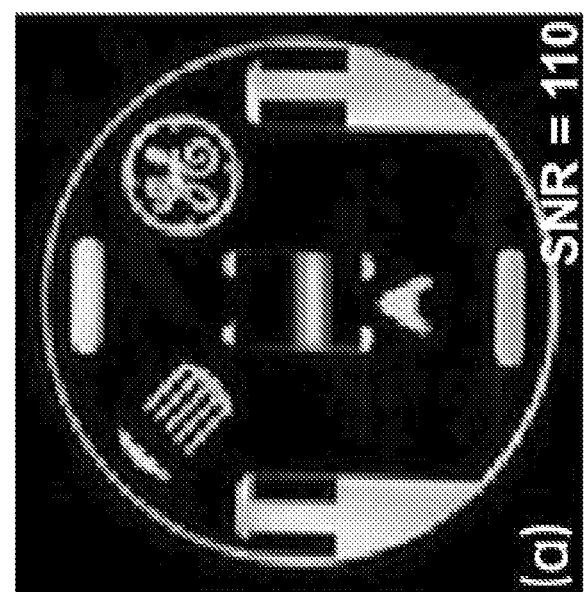

FIG. 7 shows the $T_2$-weighted images of the phantom scans acquired at 3 T. The Steer-PROP image (FIG. 7b) is visually comparable to the FSE-PROPELLER image (FIG. 7a). SNR measurements revealed about a 30% reduction for the Steer-PROP compared to FSE-PROP images, but the imaging speed was improved 3-fold.

Figure 8:
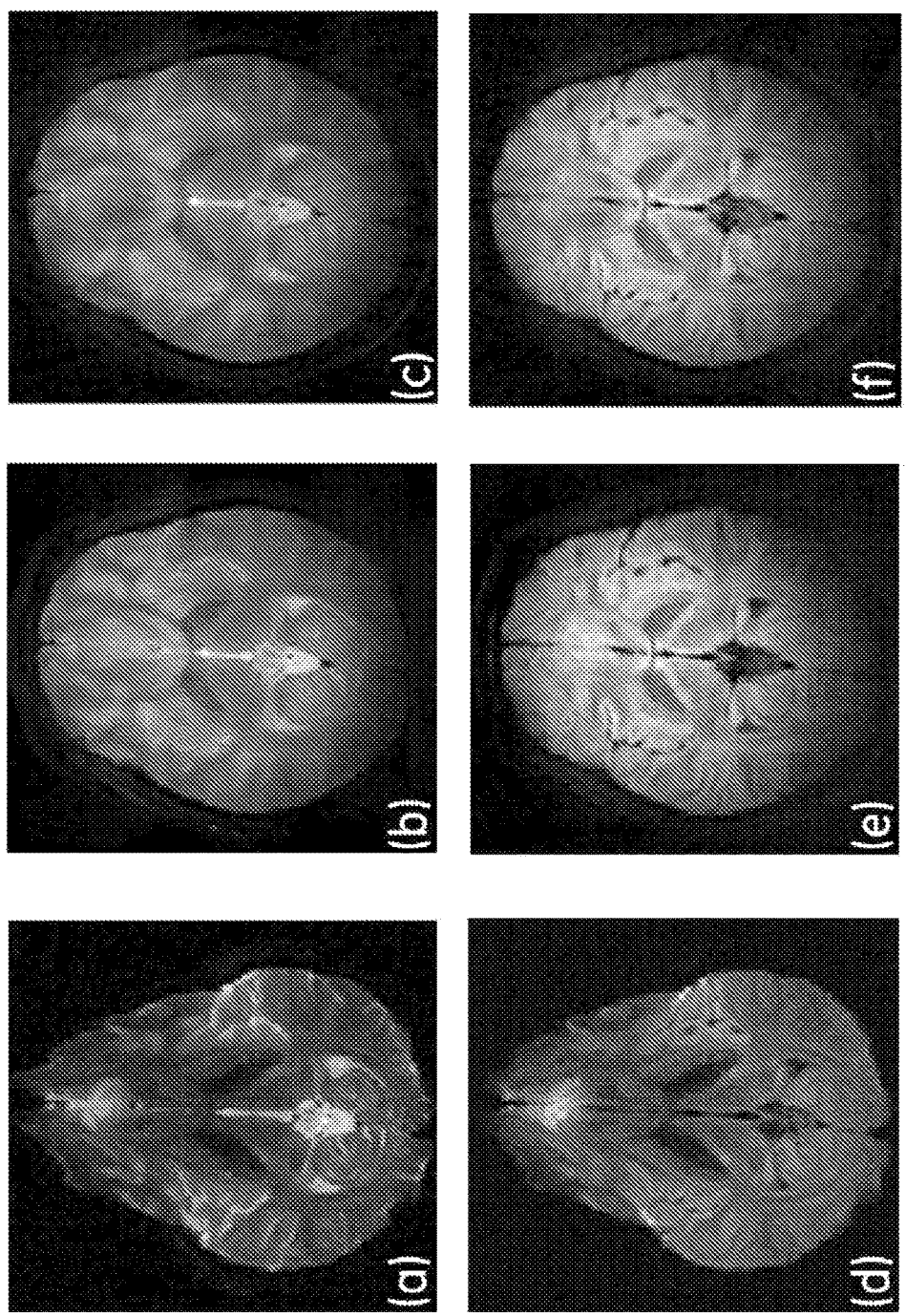
FIG. 8(a-f) illustrates T2 (a, b, c) and Diffusion (b=500 s/mm$^2$) (c, d, e) weighted human volunteer images obtained at 3 T comparing single-shot EPI (a, d), FSE-PROP (b, e) and Steer-PROP (c, f).

$T_2$- and diffusion-weighted images obtained with a b=500 s/mm$^2$ on a human subject using EPI, FSE-PROPELLER and Steer-PROP are shown in FIG. 8. The image quality for Steer-PROP (FIG. 8c, f) was comparable to that of FSE-PROP (FIG. 8b, e). The severe distortion seen on EPI images (FIG. 8a, d) primarily due to off-resonance effects such as magnetic susceptibility was appreciably improved on the Steer-PROP images. Shading was observed in the Steer-PROP images on the posterior side of the brain due to dielectric resonance at 3 T.

Figure 9:
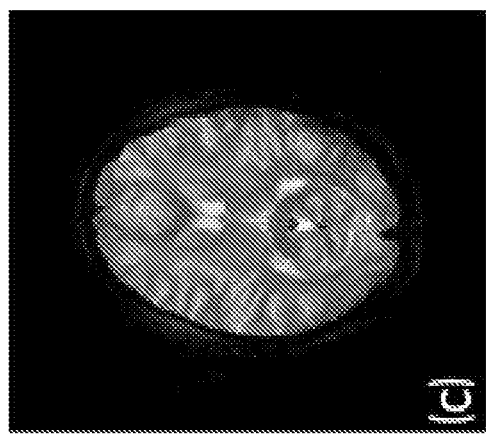
FIG. 9(a-c) illustrates T2 images of volunteer performing a pre-determined head motion action obtained using (a) FSE, (b) FSE-PROP and (c) Steer-PROP.
Figure 9:
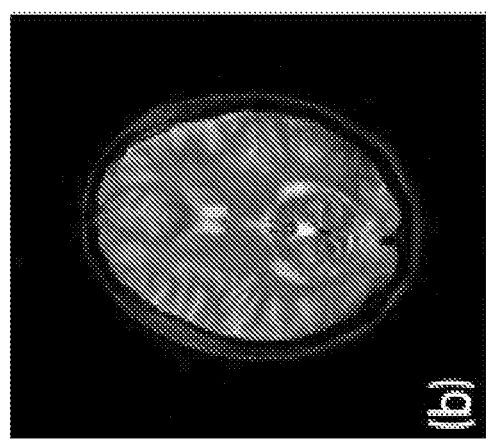
Figure 9:
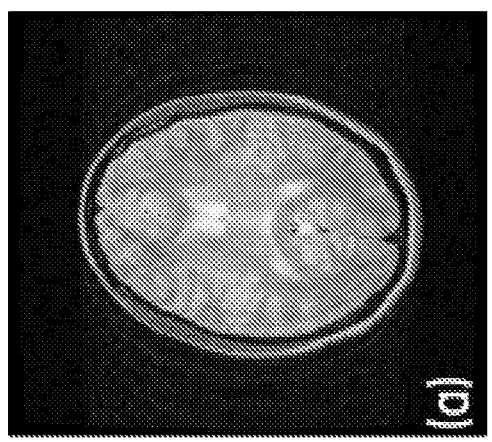

Images comparing performance on motion induced scans using conventional FSE, FSE-PROPELLER and Steer-PROP sequences are shown in FIG. 9. While the FSE images (FIG. 9a) showed severing motion related ghosting, both FSE-PROPELLER (FIG. 9b) and Steer-PROP (FIG. 9c) performed comparably in eliminating the motion artifacts.

Figure 10:
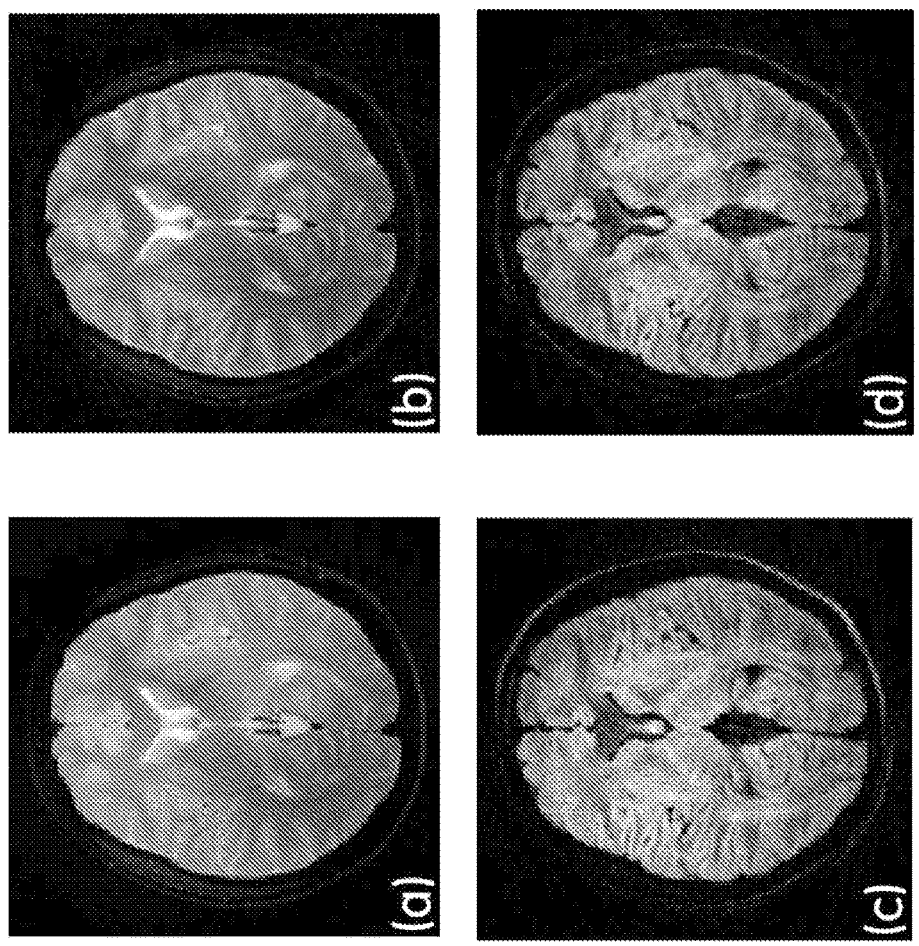
FIG. 10(a-d) illustrates T2 (a, b) and Diffusion (b=750 s/mm$^2$) (c, d) weighted human volunteer images obtained at 1.5 T using FSE-PROP (a, c) and Steer-PROP (b, d) with TR=4 s and TE=72 ms.

FIG. 10 shows the comparison results of $T_2$- and diffusion-weighted images with b=750 s/mm$^2$ acquired at 1.5 T field strength. The Steer-PROP images (FIG. 10b, d) once again displayed comparable image quality to that of the FSE-PROP images (FIG. 10a, c) although with a slight difference in contrast. The Steer-PROP images have a combined $T_2$ and $T_2$* weighting. The $T_2$* effect produced the contrast difference observed. The run time for the Steer-PROP sequence was ~2 min compared to ~6 min for the corresponding FSE-PROP. It can also be noted that the Steer-PROP images do not show any dielectric shading at this field strength.

Figure 11:
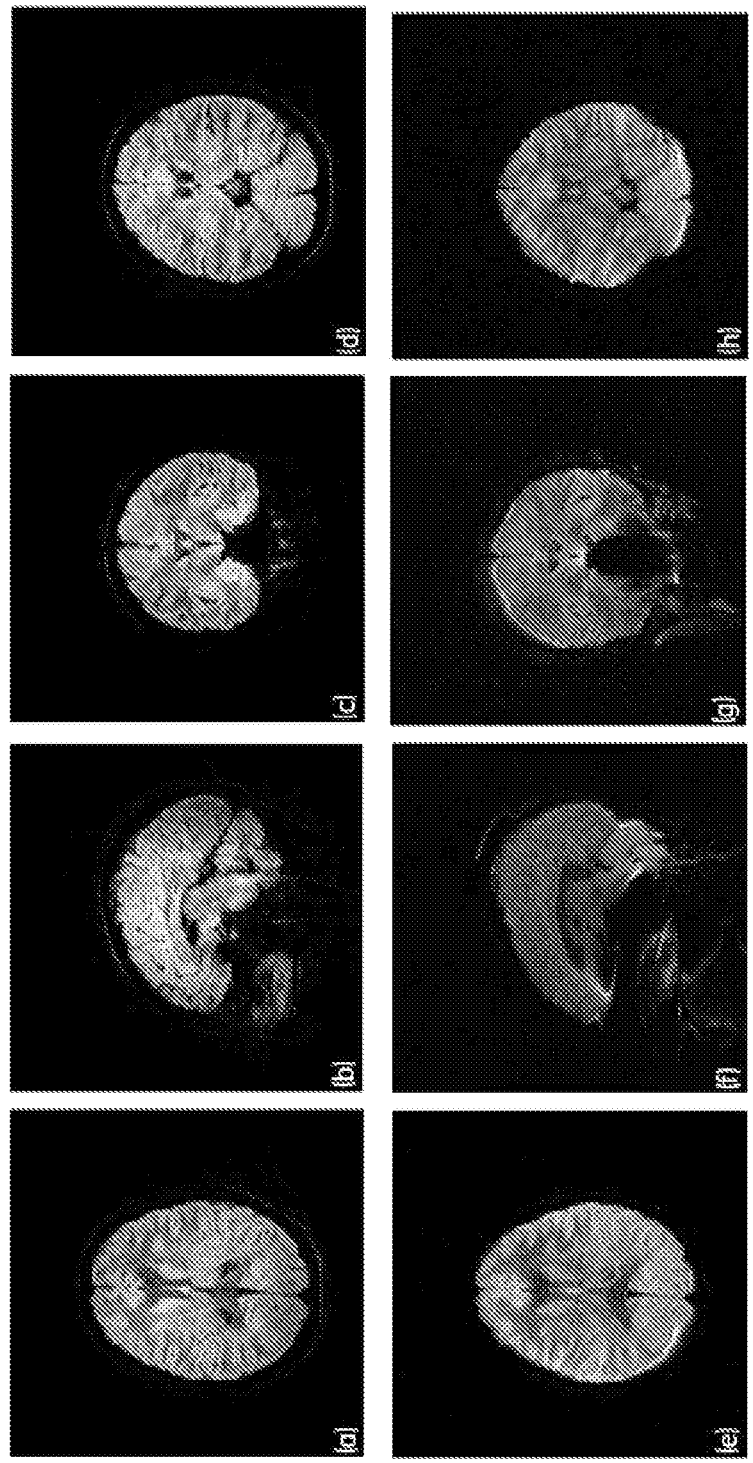
FIG. 11(a-f) illustrates diffusion-weighted images from Steer-PROP (a-d) and SS-EPI (e-h) on axial (a, e), sagittal (b, f), coronal (c, g) and oblique (d, h) planes.

Finally the results of the Steer-PROP sequence on non-axial diffusion-weighted scan of a human subject are shown in FIG. 11, in comparison with the conventional Single-Shot EPI. The axial images (FIG. 11a, e) showed the smallest discrepancies, as expected, because of the small magnetic susceptibility differences in the specific imaging plane and the relatively small contributions from the concomitant gradient. For images acquired in sagittal plane, the SS-EPI images (FIG. 11f) exhibited substantial gross distortion largely due to concomitant gradient fields as well as localized distortion arising from the magnetic susceptibility differences in the frontal lobe. Both types of distortion were virtually eliminated in the corresponding Steer-PROP image (FIG. 11b). Similar improvements were also observed in coronal (FIG. 11c) and oblique (FIG. 11d) planes.

3. Conclusion

An exemplary embodiment of the present invention has been described above. Those skilled in the art will understand, however, that changes and modifications may be made to this embodiment without departing from the true scope and spirit of the invention, which is defined by the claims.

REFERENCES (1) Pipe J G. Motion correction with PROPELLER MRI: application to head motion and free-breathing cardiac imaging. Magn Reson Med 1999; 42:963-969.

(2) Chuang T C, Huang T Y, Lin F H, Wang F N, Juan C J, Chung H W, Chen C Y, Kwong K K. PROPELLER-EPI with parallel imaging using a circularly symmetric phased-array RF coil at 3.0 T: Application to high-resolution diffusion tensor imaging. Magnetic Resonance in Medicine 2006; 56:1352-1358.

(3) Skare S, Newbould R D, Clayton D B, Bammer R. Propeller EPI in the other direction. Magnetic Resonance in Medicine 2006; 55:1298-1307.

(4) Aldefeld B, Bornert P. Effects of gradient anisotropy in MRI. Magnetic Resonance in Medicine 1998; 39:606-614.

(5) Zhou X J, Maier J K. A new Nyquist ghost in oblique EPI. Proc Int'l Soc Magn Reson Med 4th Meeting; New York, N.Y. p 386. 1996.

(6) Zhou X, Maier J K, Epstein F H; Reduction of Nyquist ghost artifacts in oblique echo planar images. U.S. Pat. No. 5,672,969. 1997 Sep. 30, 1997.

(7) Reeder S B, Atalar E, Faranesh A Z, McVeigh E R. Referenceless interleaved echo-planar imaging. Magnetic Resonance in Medicine 1999; 41:87-94.

(8) Pipe J G, Farthing V G, Forbes K P. Multishot diffusion-weighted FSE using PROPELLER MRI. Magnetic Resonance in Medicine 2002; 47:42-52.

(9) Pipe, J. G. and N. Zwart, *Turboprop: Improved PROPELLER imaging*. Magnetic Resonance in Medicine, 2006. 55(2): p. 380-385.

(10) Hennig J, Mueri M. Fast Imaging Using Burst Excitation Pulses. Abstracts of the Soc Magn Reson Med 1988: 238.

(11) Ahn C B, Cho Z H. A new phase correction method in NMR imaging based on autocorrelation and histogram analysis. IEEE Transactions on Medical Imaging 1987; 6:32-36.

(12) Hinks R S, Kohli J, Washburn S. Fast spin echo prescan for artifact reduction. Third Soc Magn Reson Abstract; Nice, France. p 634. 1995.
(13) Maier J K, Vavrek M, Glover G H; Correction of NMR data acquired by an echo-planar technique. U.S. Pat. No. 5,151,656. 1992 1992.

What is claimed:

1. In a magnetic resonance imaging (MRI) system, a computer-implemented method comprising:
   applying to an object in the MRI system a first radio frequency (RF) pulse and, after a first fast spin echo (FSE) inter-echo time interval, applying to the object a second RF pulse;
   applying to the object during the first FSE inter-echo time interval between the first and second RF pulses a first magnetic field gradient ($G_x$) pulse train along a first direction, the first $G_x$ pulse train comprising an integer number M adjacent $G_x$ pulses, each consecutive pair of $G_x$ pulses of the first $G_x$ pulse train being separated by a $G_x$ steering pulse, and the last $G_x$ pulse of the first $G_x$ pulse train being followed by a first $G_x$ rewinding pulse;
   applying to the object simultaneously with the first $G_x$ pulse train a first magnetic field gradient ($G_y$) pulse train along a second direction, the first $G_y$ pulse train comprising M adjacent $G_y$ pulses, each $G_y$ pulse of the first $G_y$ pulse train forming a respective first-train $G_x$-$G_y$ pulse pair with a simultaneous corresponding $G_x$ pulse of the first $G_x$ pulse train, each consecutive pair of $G_y$ pulses of the first $G_y$ pulse train being separated by a $G_y$ steering pulse that forms a respective first-train $G_x$-$G_y$ steering-pulse pair with a simultaneous corresponding $G_x$ steering pulse of the first $G_x$ pulse train, and the last $G_y$ pulse of the first $G_y$ pulse train being followed by a first $G_y$ rewinding pulse that forms a first simultaneous $G_x$-$G_y$ rewinding-pulse pair with the first $G_x$ rewinding pulse of the first $G_x$ pulse train;
   acquiring k-space data along a first set of M mutually oblique lines intersecting in a central region of k-space, each of the M mutually oblique lines of the first set corresponding to a different respective first-train $G_x$-$G_y$ pulse pair,
   wherein applying each first-train $G_x$-$G_y$ steering-pulse pair repositions a starting point for k-space traversal from one of the M mutually oblique lines of the first set to another,
   and wherein applying the first simultaneous $G_x$-$G_y$ rewinding-pulse pair repositions a starting point for k-space traversal to a reference location of k-space.

2. The method of claim 1, further comprising:
   applying to the object a third RF pulse at a second FSE inter-echo time interval following the second RF pulse;
   applying to the object during the second FSE inter-echo time interval between the second and third RF pulses a second $G_x$ pulse train comprising M adjacent $G_x$ pulses, each consecutive pair of $G_x$ pulses of the second $G_x$ pulse train being separated by a $G_x$ steering pulse, and the last $G_x$ pulse of the second $G_x$ pulse train being followed by a second $G_x$ rewinding pulse;
   applying to the object simultaneously with the second $G_x$ pulse train a second $G_y$ pulse train comprising M adjacent $G_y$ pulses, each $G_y$ pulse of the second $G_y$ pulse train forming a respective second-train $G_x$-$G_y$ pulse pair with a simultaneous corresponding $G_x$ pulse of the second $G_x$ pulse train, each consecutive pair of $G_y$ pulses of the second $G_y$ pulse train being separated by a $G_y$ steering pulse that forms a respective second-train $G_x$-$G_y$ steering-pulse pair with a simultaneous corresponding $G_x$ steering pulse of the second $G_x$ pulse train, and the last $G_y$ pulse of the second $G_y$ pulse train being followed by a second $G_y$ rewinding pulse that forms a second simultaneous $G_x$-$G_y$ rewinding-pulse pair with second $G_x$ rewinding pulse of the second $G_x$ pulse train;
   acquiring k-space data along a second set of M mutually oblique lines intersecting in a central region of k-space, each of the M mutually oblique lines of the second set corresponding to a different respective second-train $G_x$-$G_y$ pulse pair,
   wherein each of the M mutually oblique lines of the second set is parallel to a corresponding one of the M mutually oblique lines of the first set,
   wherein applying each second-train $G_x$-$G_y$ steering-pulse pair repositions a starting point for k-space traversal from one of the M mutually oblique lines of the second set to another,
   and wherein applying the second simultaneous $G_x$-$G_y$ rewinding-pulse pair repositions a starting point for k-space traversal to the reference location of k-space.

3. The method of claim 1, wherein M is in the range 3-7.

4. The method of claim 1, wherein applying the first simultaneous $G_x$-$G_y$ rewinding-pulse pair causes a Carr-Purcell-Meiboom-Gill (CPMG) condition to be satisfied.

5. The method of claim 1, further comprising applying to the object an initial pair of $G_x$ and $G_y$ pulses prior to the first $G_x$ pulse train in order to set the reference location of k-space.

6. The method of claim 1, wherein the reference location of k-space is at an origin of k-space, the origin of k-space being the center of k-space.

7. The method of claim 1, wherein the reference location of k-space is substantially close to an origin of k-space, the origin of k-space being the center of k-space.

8. The method of claim 1, further comprising applying to the object an initial excitation RF pulse prior to the first RF pulse,
   wherein the first and second RF pulses are refocusing RF pulses.

9. In a magnetic resonance imaging (MM) system, a computer-implemented method comprising:
   applying to an object in the MRI system a first gradient and spin echo propeller (GRASP) pulse sequence comprising a first radio frequency (RF) sequence of periodic RF pulses, an accompanying first magnetic field gradient ($G_x$) sequence of periodic $G_x$ pulse trains along a first direction, and an accompanying corresponding first magnetic field gradient ($G_y$) sequence of periodic $G_y$ pulse trains along a second direction, the first RF, $G_x$ and $G_y$ sequences being configured to cause traversal in k-space along a first plurality of parallel line groupings, each parallel line grouping of the first plurality forming a respective first GRASP blade, and each respective first GRASP blade being oblique to the other respective first GRASP blades and intersecting the other respective first GRASP blades in a central region of k-space;
   acquiring first GRASP k-space data from along the parallel line groupings of the first plurality during a first repetition time interval corresponding to a duration of the first GRASP pulse sequence;
   applying to the object a second GRASP pulse sequence comprising a second radio RF sequence of periodic RF pulses, an accompanying second $G_x$ sequence of periodic $G_x$ pulse trains, and an accompanying corresponding second $G_y$ sequence of periodic $G_y$ pulse trains, the second RF, $G_x$ and $G_y$ sequences being configured to cause traversal in k-space along a second plurality of parallel line groupings, each parallel line grouping of the second plurality forming a respective second GRASP blade, and each respective second GRASP blade being oblique to the other respective second GRASP blades and intersecting the other respective second GRASP blades in a central region of k-space;

acquiring second GRASP k-space data from along the parallel line groupings of the second plurality during a second repetition time interval corresponding to a duration of the second GRASP pulse sequence; and separately determining and independently correcting:
(i) phase errors in the acquired first GRASP k-space data between parallel lines of each respective first GRASP blade,
(ii) phase errors in the acquired first GRASP k-space data between the respective first GRASP blades,
(iii) phase errors in the acquired second GRASP k-space data between parallel lines of each respective second GRASP blade,
(iv) phase errors in the acquired second GRASP k-space data between the respective second GRASP blades, and
(v) phase errors in the acquired first GRASP and second GRASP k-space data between the first GRASP pulse sequence and the second GRASP pulse sequence.

10. The method of claim 9, further comprising:
applying to the object a third GRASP pulse sequence comprising a third radio RF sequence of periodic RF pulses, an accompanying third $G_x$ sequence of periodic $G_x$ pulse trains, and an accompanying corresponding third $G_y$ sequence of periodic $G_y$ pulse trains, the third RF, $G_x$ and $G_y$ sequences being configured to cause traversal in k-space along a third plurality of parallel line groupings, each parallel line grouping of the third plurality forming a respective third GRASP blade, and each respective third GRASP blade being oblique to the other respective third GRASP blades and intersecting the other respective third GRASP blades in a central region of k-space;

acquiring third GRASP k-space data from along the parallel line groupings of the third plurality during a third repetition time interval corresponding to a duration of the third GRASP pulse sequence; and separately determining and independently correcting:
(i) phase errors in the acquired third GRASP k-space data between parallel lines of each respective third GRASP blade,
(ii) phase errors in the acquired third GRASP k-space data between the respective third GRASP blades, and
(iii) phase errors in the acquired first GRASP, second GRASP and third GRASP k-space data between the first GRASP pulse sequence, the second GRASP pulse sequence and the third GRASP pulse sequence.

11. The method of claim 9, wherein the first $G_x$ sequence comprises an integer number N periodic $G_x$ pulse trains, and the first $G_y$ sequence comprises N corresponding periodic $G_y$ pulse trains,
wherein each periodic $G_x$ pulse train of the first $G_x$ sequence comprises an integer number M $G_x$ pulses, and each periodic $G_y$ pulse train of the first $G_y$ sequence comprises M corresponding $G_y$ pulses,
wherein each of the M $G_x$ pulses of each periodic $G_x$ pulse train of the first $G_x$ sequence is applied simultaneously with a corresponding one of the M $G_y$ pulses of a corresponding one of the periodic $G_y$ pulse trains of the first $G_y$ sequence, wherein the first plurality includes M parallel line groupings corresponding to M first GRASP blades,
and wherein each first GRASP blade includes N parallel lines of k-space traversal.

12. The method of claim 11, wherein M is in the range 3-7 and N is in the range 4-64.

13. The method of claim 9, further comprising:
applying to the object a first excitation RF pulse prior to the first RF sequence; and
applying to the object a second excitation RF pulse prior to the second RF sequence,
wherein the first sequence of periodic RF pulses comprises a first sequence of refocusing RF pulses,
and wherein the second sequence of periodic RF pulses comprises a second sequence of refocusing RF pulses.

14. The method of claim 11, wherein separately determining and independently correcting phase errors in the acquired first GRASP k-space data between parallel lines of each respective first GRASP blade comprises:
applying to the object a first reference GRASP pulse sequence identical to the first GRASP pulse sequence but having no first $G_y$ sequence and not resulting in blades that are oblique to one another;
acquiring first reference GRASP k-space data during a first reference time interval corresponding to a duration of the first reference GRASP pulse sequence, the first reference GRASP k-space data corresponding to M $G_x$ reference blades, each comprising N parallel reference lines of k-space data;
applying to the object a second reference GRASP pulse sequence identical to the first GRASP pulse sequence but having no first $G_x$ sequence and not resulting in blades that are oblique to one another;
acquiring second reference GRASP k-space data during a second reference time interval corresponding to a duration of the second reference GRASP pulse sequence, the second reference GRASP k-space data corresponding to M $G_y$ reference blades, each comprising N parallel reference lines of k-space data;
determining a spatially constant phase error $\alpha_{1mn}$ and a spatially linear phase error $\beta_{1mn}$, m =1, . . . , M and n =1, . . . , N corresponding respectively to each of the N parallel lines of k-space data in each of the M $G_x$ reference blades from the acquired first reference GRASP k-space data, by computing a Fourier transform of the first reference GRASP k-space data;
determining a spatially constant phase error $\alpha_{2mn}$ and a spatially linear phase error $\beta_{2mn}$, m =1, . . . , M and n =1, . . . , N corresponding respectively to each of the N parallel lines of k-space data in each of the M $G_y$ reference blades from the acquired second reference GRASP k-space data, by computing a Fourier transform of the second reference GRASP k-space data;
determining a spatially constant phase error $\xi_{mn}$ and a linear phase error $\psi_{mn}$, m=1, . . . , M and n=1, . . . , N for each of the N parallel lines in each of the M first GRASP blades by computing:

$$\xi_{mn} = \alpha_{1mn} \cos \phi_m + \alpha_{2mn} \sin \phi_m, \text{ and}$$

$$\psi_{mn} = \beta_{1mn} \cos^2 \phi_m + \beta_{2mn} \sin^2 \phi_m,$$

wherein $\phi_m$ is an orientation angle of the $m^{th}$ first GRASP blade in k-space;
determining a phase-error correction corresponding to the k-space data of each of the N parallel lines of each of the M first GRASP blades to compensate for the determined spatially constant phase error $\xi_{mn}$ and a spatially linear phase error $\psi_{mn}$; and applying the determined phase-error correction to the k-space data of each of the N parallel lines of each of the M first GRASP blades.

15. The method of claim 14, wherein separately determining and independently correcting phase errors in the acquired first GRASP k-space data between the respective first GRASP blades comprises:

setting a particular blade of each of the first and second pluralities of reference blades as inter-blade references;

determining estimated phases errors of each of the remaining blades of the first and second pluralities of reference blades with respect to the inter-blade references; and applying the estimated phase errors from the first and second pluralities of reference blades to first GRASP k-space data.

16. The method of claim 15, wherein the second $G_x$ sequence comprises N periodic $G_x$ pulse trains, and the second $G_y$ sequence comprises N corresponding periodic $G_y$ pulse trains, wherein each periodic $G_x$ pulse train of the second $G_x$ sequence comprises M $G_x$ pulses, and each periodic $G_y$ pulse train of the second $G_y$ sequence comprises M $G_y$ pulses, wherein each of the M $G_x$ pulses of each periodic $G_x$ pulse train of the second $G_x$ sequence is applied simultaneously with a corresponding one of the M $G_y$ pulses of a corresponding one of the periodic $G_y$ pulse trains of the second $G_y$ sequence, wherein the second plurality includes M parallel line groupings corresponding to M second GRASP blades, wherein each second GRASP blade includes N parallel lines of k-space traversal, and wherein separately determining and independently correcting phase errors in the acquired second GRASP k-space data between parallel lines of each respective second GRASP blade comprises:

determining a spatially constant phase error $\xi_{mn}$ and a linear phase error $\psi_{mn}$, m=1, ..., M and n=1, ..., N for each of the N parallel lines in each of the M second GRASP blades by computing:

$\xi_{mn} = \alpha_{1mn} \cos \phi_m + \alpha_{2mn} \sin \phi_m$, and $\psi_{mn} = \beta_{1mn} \cos^2 \phi_m + \beta_{2mn} \sin^2 \phi_m$, wherein $\phi_m$ is an orientation angle of the $m^{th}$ second GRASP blade in k-space;

determining a phase-error correction corresponding to the k-space data of each of the N parallel lines of each of the M second GRASP blades to compensate for the determined spatially constant phase error $\xi_{mn}$ and a linear phase error $\psi_{mn}$; and applying the determined phase-error correction to the k-space data of each of the N parallel lines of each of the M second GRASP blades.

17. The method of claim 16, wherein separately determining and independently correcting phase errors in the acquired second GRASP k-space data between the respective second GRASP blades comprises:

applying the estimated phase errors from the first and second pluralities of reference blades to second GRASP k-space data.

18. The method of claim 17, wherein separately determining and independently correcting phase errors in the acquired first GRASP and second GRASP k-space data between the first GRASP pulse sequence and the second GRASP pulse sequence comprises:

making a comparison (i) first central k-space data from a portion of the first GRASP blades corresponding to a central region of k-space with (ii) second central k-space data from a portion of the second GRASP blades corresponding to the same central region of k-space;

identifying phase inconsistencies between the first k-space data and second central k-space data based on the comparison; and applying a phase correction to the first GRASP k-space data and the second GRASP k-space data to remove the identified phase inconsistencies.

19. A magnetic resonance imaging (MRI) system comprising:

one or more processors;

memory;

a bore magnet;

a plurality of gradient coils positioned about the bore of a magnet;

an RF transceiver system;

an RF coil assembly;

a pulse module for transmitting signals to the RF coil assembly;

an RF switch controlled the a pulse module;

and machine-readable instructions stored in the memory that, when executed by the one or more processors, cause the MRI system to carry out functions including:

applying to an object in the MRI system a first radio frequency (RF) pulse and, after a first fast spin echo (FSE) inter-echo time interval, applying to the object a second RF pulse, applying to the object during the first FSE inter-echo time interval between the first and second RF pulses a first magnetic field gradient ($G_x$) pulse train along a first direction, the first $G_x$ pulse train comprising an integer number M adjacent $G_x$ pulses, each consecutive pair of $G_x$ pulses of the first $G_x$ pulse train being separated by a $G_x$ steering pulse, and the last $G_x$ pulse of the first $G_x$ pulse train being followed by a first $G_x$ rewinding pulse, applying to the object simultaneously with the first $G_x$ pulse train a first magnetic field gradient ($G_y$) pulse train along a second direction, the first $G_y$ pulse train comprising M adjacent $G_y$ pulses, each $G_y$ pulse of the first $G_y$ pulse train forming a respective first-train $G_x$-$G_y$ pulse pair with a simultaneous corresponding $G_x$ pulse of the first $G_x$ pulse train, each consecutive pair of $G_y$ pulses of the first $G_y$ pulse train being separated by a $G_y$ steering pulse that forms a respective first-train $G_x$-$G_y$ steering-pulse pair with a simultaneous corresponding $G_x$ steering pulse of the first $G_x$ pulse train, and the last $G_y$ pulse of the first $G_y$ pulse train being followed by a first $G_y$ rewinding pulse that forms a first simultaneous $G_x$-$G_y$ rewinding-pulse pair with the first $G_x$ rewinding pulse of the first $G_x$ pulse train, acquiring k-space data along a first set of M mutually oblique lines intersecting in a central region of k-space, each of the M mutually oblique lines of the first set corresponding to a different respective first-train $G_x$-$G_y$ pulse pair, wherein applying each first-train $G_x$-$G_y$ steering-pulse pair repositions a starting point for k-space traversal from one of the M mutually oblique lines of the first set to another, and wherein applying the first simultaneous $G_x$-$G_y$ rewinding-pulse pair repositions a starting point for k-space traversal to a reference location of k-space.

20. A magnetic resonance imaging (MRI) system comprising:
one or more processors;
memory;
a bore magnet;
a plurality of gradient coils positioned about the bore of a magnet;
an RF transceiver system;
an RF coil assembly;
a pulse module for transmitting signals to the RF coil assembly;
an RF switch controlled the a pulse module;
and machine-readable instructions stored in the memory that, when executed by the one or more processors, cause the MRI system to carry out functions including:
applying to an object in the MRI system a first gradient and spin echo propeller (GRASP) pulse sequence comprising a first radio frequency (RF) sequence of periodic RF pulses, an accompanying first magnetic field gradient ($G_x$) sequence of periodic $G_x$ pulse trains along a first direction, and an accompanying corresponding first magnetic field gradient ($G_y$) sequence of periodic $G_y$ pulse trains along a second direction, the first RF, $G_x$ and $G_y$ sequences being configured to cause traversal in k-space along a first plurality of parallel line groupings, each parallel line grouping of the first plurality forming a respective first GRASP blade, and each respective first GRASP blade being oblique to the other respective first GRASP blades and intersecting the other respective first GRASP blades in a central region of k-space,
acquiring first GRASP k-space data from along the parallel line groupings of the first plurality during a first repetition time interval corresponding to a duration of the first GRASP pulse sequence,
applying to the object a second GRASP pulse sequence comprising a second radio RF sequence of periodic RF pulses, an accompanying second $G_x$ sequence of periodic $G_x$ pulse trains, and an accompanying corresponding second $G_y$ sequence of periodic $G_y$ pulse trains, the second RF, $G_x$ and $G_y$ sequences being configured to cause traversal in k-space along a second plurality of parallel line groupings, each parallel line grouping of the second plurality forming a respective second GRASP blade, and each respective second GRASP blade being oblique to the other respective second GRASP blades and intersecting the other respective second GRASP blades in a central region of k-space,
acquiring second GRASP k-space data from along the parallel line groupings of the second plurality during a second repetition time interval corresponding to a duration of the second GRASP pulse sequence, and
separately determining and independently correcting:
(i) phase errors in the acquired first GRASP k-space data between parallel lines of each respective first GRASP blade,
(ii) phase errors in the acquired first GRASP k-space data between the respective first GRASP blades,
(iii) phase errors in the acquired second GRASP k-space data between parallel lines of each respective second GRASP blade,
(iv) phase errors in the acquired second GRASP k-space data between the respective second GRASP blades, and
(v) phase errors in the acquired first GRASP and second GRASP k-space data between the first GRASP pulse sequence and the second GRASP pulse sequence.

21. A nontransitory computer-readable medium having instructions stored thereon that, upon execution by one or more processors of a magnetic resonance imaging (MRI) system, cause the Mill system to carry out functions comprising:
applying to an object in the MRI system a first radio frequency (RF) pulse and, after a first fast spin echo (FSE) inter-echo time interval, applying to the object a second RF pulse,
applying to the object during the first FSE inter-echo time interval between the first and second RF pulses a first magnetic field gradient (GO pulse train along a first direction, the first $G_x$ pulse train comprising an integer number M adjacent $G_x$ pulses, each consecutive pair of $G_x$ pulses of the first $G_x$ pulse train being separated by a $G_x$ steering pulse, and the last $G_x$ pulse of the first $G_x$ pulse train being followed by a first $G_x$ rewinding pulse,
applying to the object simultaneously with the first $G_x$ pulse train a first magnetic field gradient ($G_y$) pulse train along a second direction, the first $G_y$ pulse train comprising M adjacent $G_y$ pulses, each $G_y$ pulse of the first $G_y$ pulse train forming a respective first-train $G_x$-$G_y$ pulse pair with a simultaneous corresponding $G_x$ pulse of the first $G_x$ pulse train, each consecutive pair of $G_y$ pulses of the first $G_y$ pulse train being separated by a $G_y$ steering pulse that forms a respective first-train $G_x$-$G_y$ steering-pulse pair with a simultaneous corresponding $G_x$ steering pulse of the first $G_x$ pulse train, and the last $G_y$ pulse of the first $G_y$ pulse train being followed by a first $G_y$ rewinding pulse that forms a first simultaneous $G_x$-$G_y$ rewinding-pulse pair with the first $G_x$ rewinding pulse of the first $G_x$ pulse train,
acquiring k-space data along a first set of M mutually oblique lines intersecting in a central region of k-space, each of the M mutually oblique lines of the first set corresponding to a different respective first-train $G_x$-$G_y$ pulse pair,
wherein applying each first-train $G_x$-$G_y$ steering-pulse pair repositions a starting point for k-space traversal from one of the M mutually oblique lines of the first set to another,
and wherein applying the first simultaneous $G_x$-$G_y$ rewinding-pulse pair repositions a starting point for k-space traversal to a reference location of k-space.

22. A nontransitory computer-readable medium having instructions stored thereon that, upon execution by one or more processors of a magnetic resonance imaging (MRI) system, cause the MRI system to carry out functions comprising:
applying to an object in the MRI system a first gradient and spin echo propeller (GRASP) pulse sequence comprising a first radio frequency (RF) sequence of periodic RF pulses, an accompanying first magnetic field gradient ($G_x$) sequence of periodic $G_x$ pulse trains along a first direction, and an accompanying corresponding first magnetic field gradient ($G_y$) sequence of periodic $G_y$ pulse trains along a second direction, the first RF, $G_x$ and $G_y$ sequences being configured to cause traversal in k-space along a first plurality of parallel line groupings, each parallel line grouping of the first plurality forming a respective first GRASP blade, and each respective first GRASP blade being oblique to the other respective first GRASP blades and intersecting the other respective first GRASP blades in a central region of k-space, acquiring first GRASP k-space data from along the parallel line groupings of the first plurality during a first repetition time interval corresponding to a duration of the first GRASP pulse sequence, applying to the object a second GRASP pulse sequence comprising a second radio RF sequence of periodic RF pulses, an accompanying second $G_x$ sequence of periodic $G_x$ pulse trains, and an accompanying corresponding second $G_y$ sequence of periodic $G_y$ pulse trains, the second RF, $G_x$ and $G_y$ sequences being configured to cause traversal in k-space along a second plurality of parallel line groupings, each parallel line grouping of the second plurality forming a respective second GRASP blade, and each respective second GRASP blade being oblique to the other respective second GRASP blades and intersecting the other respective second GRASP blades in a central region of k-space, acquiring second GRASP k-space data from along the parallel line groupings of the second plurality during a second repetition time interval corresponding to a duration of the second GRASP pulse sequence, and separately determining and independently correcting:
  (i) phase errors in the acquired first GRASP k-space data between parallel lines of each respective first GRASP blade,
  (ii) phase errors in the acquired first GRASP k-space data between the respective first GRASP blades,
  (iii) phase errors in the acquired second GRASP k-space data between parallel lines of each respective second GRASP blade,
  (iv) phase errors in the acquired second GRASP k-space data between the respective second GRASP blades, and
  (v) phase errors in the acquired first GRASP and second GRASP k-space data between the first GRASP pulse sequence and the second GRASP pulse sequence.

* * * * *